(12) United States Patent
Moslehi et al.

(10) Patent No.: US 12,352,469 B2
(45) Date of Patent: *Jul. 8, 2025

(54) SOLAR PHOTOVOLTAIC BLINDS AND CURTAINS FOR RESIDENTIAL AND COMMERCIAL BUILDINGS

(71) Applicant: Sigmagen, inc., Los Altos, CA (US)

(72) Inventors: Mehrdad M. Moslehi, Los Altos, CA (US); Pawan Kapur, Burlingame, CA (US)

(73) Assignee: Sigmagen, Inc., Los Altos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/543,848

(22) Filed: Dec. 18, 2023

(65) Prior Publication Data
US 2024/0191909 A1  Jun. 13, 2024

Related U.S. Application Data

(63) Continuation of application No. 17/074,480, filed on Oct. 19, 2020, now Pat. No. 11,867,431, which is a continuation of application No. 14/275,869, filed on May 12, 2014, now abandoned.

(60) Provisional application No. 61/822,426, filed on May 12, 2013.

(51) Int. Cl.
| | | |
|---|---|---|
| E06B 9/386 | (2006.01) | |
| F24S 20/60 | (2018.01) | |
| F24S 23/70 | (2018.01) | |
| H02S 30/20 | (2014.01) | |
| H10F 19/00 | (2025.01) | |
| H10F 19/80 | (2025.01) | |
| E06B 9/24 | (2006.01) | |

(52) U.S. Cl.
CPC .............. *F24S 20/60* (2018.05); *E06B 9/386* (2013.01); *F24S 23/82* (2018.05); *H02S 30/20* (2014.12); *H10F 19/00* (2025.01); *H10F 19/80* (2025.01); *E06B 2009/2476* (2013.01); *Y02B 10/10* (2013.01); *Y02E 10/50* (2013.01)

(58) Field of Classification Search
CPC .............. E06B 2009/2476; E06B 9/386; H01L 31/042; H01L 31/048; H02S 30/20; F24S 20/60; F24S 23/82
See application file for complete search history.

(56) References Cited

U.S. PATENT DOCUMENTS 3,407,863 A * 10/1968 Griesser .................... E06B 9/34
160/133
3,472,305 A * 10/1969 Lefes ...................... E06B 9/386
181/207

(Continued)

FOREIGN PATENT DOCUMENTS

DE  19919215 A1 * 11/2000 ............. E06B 9/386

*Primary Examiner* — Johnnie A. Shablack
(74) *Attorney, Agent, or Firm* — Pillsbury Winthrop Shaw Pittman LLP

(57) ABSTRACT

Solar photovoltaic window blind slats for power generation from internal and external light sources are provided are provided. A plurality of solar cells are attached to at least two sides of a slat core. Distributed maximum power point tracking optimizer components are associated with each solar cell. The solar cells and corresponding distributed maximum power point tracking optimizer components on each slat side are connected in electrical series.

19 Claims, 24 Drawing Sheets

(56) References Cited

U.S. PATENT DOCUMENTS

| | | | | |
|---|---|---|---|---|
| 4,137,098 A * | 1/1979 | Field | H01L 31/0488 | 126/633 |
| 4,424,849 A * | 1/1984 | Robertson | A47H 13/14 | 160/124 |
| 4,636,579 A * | 1/1987 | Hanak | H02S 30/20 | 136/246 |
| 5,040,585 A * | 8/1991 | Hiraki | E06B 9/32 | 136/246 |
| 5,141,042 A * | 8/1992 | Schwaegerle | E06B 9/386 | 29/24.5 |
| 5,221,363 A * | 6/1993 | Gillard | H01L 31/0488 | 52/173.3 |
| 5,391,235 A * | 2/1995 | Inoue | H01L 31/03921 | 136/244 |
| 5,413,161 A * | 5/1995 | Corazzini | E05F 15/71 | 160/168.1 P |
| 5,665,175 A * | 9/1997 | Safir | H01L 31/1804 | 136/255 |
| 5,760,558 A * | 6/1998 | Popat | E06B 9/32 | 160/188 |
| 5,928,437 A * | 7/1999 | Dillard | H01L 31/042 | 438/57 |
| 6,055,089 A * | 4/2000 | Schulz | G02F 1/163 | 359/275 |
| 6,239,910 B1 * | 5/2001 | Digert | E06B 9/386 | 359/597 |
| 6,600,100 B2 * | 7/2003 | Ho | H01L 31/06875 | 136/261 |
| 6,653,550 B2 * | 11/2003 | Hayashi | H01L 31/0445 | 136/249 |
| 6,966,184 B2 * | 11/2005 | Toyomura | H02S 40/36 | 257/E27.123 |
| 7,077,123 B2 * | 7/2006 | Jarvinen | E06B 7/08 | 126/573 |
| 7,557,292 B2 * | 7/2009 | Shingleton | F24S 25/12 | 136/246 |
| 7,576,282 B2 * | 8/2009 | Heidenreich | E04F 10/06 | 136/243 |
| 7,612,283 B2 * | 11/2009 | Toyomura | H01L 31/02021 | 136/244 |
| 7,617,857 B2 * | 11/2009 | Froese | F21V 33/0016 | 362/253 |
| 7,759,158 B2 * | 7/2010 | Bachrach | H01L 31/048 | 136/255 |
| 7,839,022 B2 * | 11/2010 | Wolfs | G05F 1/67 | 307/77 |
| 7,845,126 B2 * | 12/2010 | Brescia | E04B 2/885 | 52/173.3 |
| 7,854,097 B2 * | 12/2010 | Schlyper | E06B 3/685 | 52/204.53 |
| 8,046,960 B1 * | 11/2011 | Kapany | E06B 7/02 | 52/204.593 |
| 8,058,752 B2 * | 11/2011 | Erickson, Jr. | H02M 7/003 | 307/150 |
| 8,158,450 B1 * | 4/2012 | Sheats | H01L 31/0516 | 438/57 |
| 8,207,005 B2 * | 6/2012 | Weidman | H01L 21/308 | 438/452 |
| 8,230,649 B2 * | 7/2012 | Kapany | H01L 31/02325 | 52/204.593 |
| 8,245,444 B2 * | 8/2012 | Konstantin | E06B 7/096 | 49/82.1 |
| 8,338,694 B2 * | 12/2012 | Hoffman | H01L 31/0547 | 136/246 |
| 8,350,513 B2 * | 1/2013 | Feldstein | E06B 9/42 | 318/266 |
| 8,365,800 B2 * | 2/2013 | Oh | E06B 9/386 | 160/168.1 P |
| 8,541,726 B2 * | 9/2013 | Hightower | H01L 31/02021 | 136/246 |
| 8,624,436 B2 * | 1/2014 | Willis | G05F 1/67 | 307/77 |
| 8,678,067 B2 * | 3/2014 | Berezhnyy | H02S 20/30 | 160/1 |
| 8,678,069 B2 * | 3/2014 | Choi | E06B 9/264 | 160/127 |
| 8,814,374 B2 * | 8/2014 | Van Der Poel | E06B 9/32 | 362/276 |
| 9,022,019 B2 * | 5/2015 | Jeronimo Lopes | F24S 10/75 | 126/621 |
| 9,035,626 B2 * | 5/2015 | Stratakos | H03K 17/693 | 323/271 |
| 9,106,105 B2 * | 8/2015 | McCaslin | H02J 3/46 | |
| 9,202,954 B2 * | 12/2015 | Evelsizer | H01L 31/035227 | |
| 9,219,171 B2 * | 12/2015 | Moslehi | H01L 31/0682 | |
| 9,293,619 B2 * | 3/2016 | Moslehi | H01L 31/022441 | |
| 9,299,861 B2 * | 3/2016 | Meyer | H01L 31/048 | |
| 9,373,959 B2 * | 6/2016 | Jang | H02S 40/38 | |
| 9,379,258 B2 * | 6/2016 | Kapur | H01L 27/1421 | |
| 9,397,251 B2 * | 7/2016 | Eickelmann | H01L 31/0504 | |
| 9,397,610 B2 * | 7/2016 | Han | H02S 40/34 | |
| 9,462,908 B2 * | 10/2016 | Haen | E06B 9/24 | |
| 9,515,217 B2 * | 12/2016 | Moslehi | H01L 31/18 | |
| 9,773,933 B2 * | 9/2017 | Meyer | F24S 25/16 | |
| 9,911,875 B2 * | 3/2018 | Kommera | H01L 31/0516 | |
| 10,181,541 B2 * | 1/2019 | Moslehi | H01L 31/0516 | |
| 10,205,421 B2 * | 2/2019 | Hall | H02S 20/30 | |
| 10,211,631 B2 * | 2/2019 | Ponec | H02J 1/00 | |
| 10,458,179 B2 * | 10/2019 | Hall | H02S 30/10 | |
| 10,597,936 B2 * | 3/2020 | Lee | E06B 9/386 | |
| 10,724,291 B2 * | 7/2020 | Tabadkani | E06B 9/24 | |
| 10,784,815 B2 * | 9/2020 | Moslehi | H02S 40/34 | |
| 10,822,869 B2 * | 11/2020 | Hall | E06B 9/303 | |
| 10,907,408 B2 * | 2/2021 | Ahmed | E06B 9/368 | |
| 11,362,228 B2 * | 6/2022 | Atwater | H02S 30/20 | |
| 11,658,607 B2 * | 5/2023 | Roldan Molinero | E06B 9/303 | 136/245 |
| 11,867,431 B2 * | 1/2024 | Moslehi | F24S 23/82 | |
| 2003/0140962 A1 * | 7/2003 | Sharps | H01L 31/0735 | 257/E31.022 |
| 2004/0055633 A1 * | 3/2004 | Lambey | H02S 30/20 | 160/237 |
| 2004/0118446 A1 * | 6/2004 | Toyomura | H02S 40/32 | 136/251 |
| 2005/0102934 A1 * | 5/2005 | Winarski | H01L 31/0488 | 52/204.6 |
| 2007/0056579 A1 * | 3/2007 | Straka | H01L 31/0547 | 126/570 |
| 2007/0131270 A1 * | 6/2007 | Gaudiana | H10K 85/151 | 136/252 |
| 2007/0215200 A1 * | 9/2007 | Lim | H01L 31/0504 | 136/246 |
| 2007/0278200 A1 * | 12/2007 | Muromachi | H05B 3/86 | 219/203 |
| 2008/0238195 A1 * | 10/2008 | Shaver | H02H 9/041 | 307/18 |
| 2008/0283115 A1 * | 11/2008 | Fukawa | H01L 31/048 | 136/246 |
| 2009/0014057 A1 * | 1/2009 | Croft | H02S 50/00 | 136/246 |
| 2009/0014058 A1 * | 1/2009 | Croft | H02S 20/23 | 136/244 |
| 2009/0145473 A1 * | 6/2009 | Chien | H01L 31/04 | 136/246 |
| 2010/0116325 A1 * | 5/2010 | Nikoonahad | H02J 3/381 | 136/251 |
| 2010/0243025 A1 * | 9/2010 | Bhatia | H01L 31/02021 | 136/244 |
| 2010/0262293 A1 * | 10/2010 | Byberg | E06B 9/68 | 700/275 |
| 2011/0048656 A1 * | 3/2011 | Chu | H02S 40/36 | 160/310 |
| 2011/0068637 A1 * | 3/2011 | Kiamilev | G05F 1/67 | 307/151 |
| 2011/0083715 A1 * | 4/2011 | Kang | H01L 31/0201 | 136/252 |
| 2011/0126992 A1 * | 6/2011 | Yordanova | H02S 20/30 | 160/405 |

(56) References Cited

U.S. PATENT DOCUMENTS

| | | | | |
|---|---|---|---|---|
| 2011/0253319 A1* | 10/2011 | Schaupp | E06B 9/42 | 362/253 |
| 2011/0265857 A1* | 11/2011 | Wang | H01L 31/046 | 257/E31.124 |
| 2012/0062035 A1* | 3/2012 | Estibals | H01L 31/02021 | 257/E31.11 |
| 2012/0103394 A1* | 5/2012 | Khazeni | H02S 20/30 | 136/246 |
| 2012/0118359 A1* | 5/2012 | Battistutti | H02S 20/26 | 136/251 |
| 2013/0199515 A1* | 8/2013 | Tandler | F28D 20/0039 | 126/623 |
| 2014/0000683 A1* | 1/2014 | Pretorius | H01L 31/044 | 438/66 |
| 2014/0020852 A1* | 1/2014 | Thielemann | E06B 7/02 | 160/127 |
| 2014/0027069 A1* | 1/2014 | Oppizzi | E06B 9/40 | 160/6 |
| 2014/0111007 A1* | 4/2014 | Liao | H01L 31/03926 | 307/23 |
| 2014/0116497 A1* | 5/2014 | Sanders | H02S 40/32 | 136/246 |
| 2014/0183960 A1* | 7/2014 | Balachandreswaran | H02M 7/42 | 307/82 |
| 2014/0224434 A1* | 8/2014 | Gross | E06B 9/42 | 160/405 |
| 2014/0326295 A1* | 11/2014 | Moslehi | H01L 31/0201 | 438/59 |
| 2014/0345669 A1* | 11/2014 | Feist | H01L 31/1884 | 438/73 |
| 2014/0345674 A1* | 11/2014 | Yang | H01L 31/049 | 438/66 |
| 2015/0101761 A1* | 4/2015 | Moslehi | E06B 9/386 | 160/107 |
| 2015/0155398 A1* | 6/2015 | Moslehi | H01L 31/0516 | 136/244 |
| 2015/0204561 A1* | 7/2015 | Sadwick | F24F 11/33 | 236/1 C |
| 2015/0207002 A1* | 7/2015 | Moslehi | H01L 31/0465 | 438/71 |
| 2015/0236638 A1* | 8/2015 | Moslehi | H02J 3/381 | 136/251 |
| 2015/0255654 A1* | 9/2015 | Morgan | H01L 31/02008 | 136/246 |
| 2015/0326177 A1* | 11/2015 | Koehler | H02S 40/34 | 29/857 |
| 2016/0087132 A1* | 3/2016 | Alteneiji | H02S 50/00 | 438/59 |
| 2016/0087579 A1* | 3/2016 | Moslehi | H01L 31/1896 | 136/251 |
| 2016/0190365 A1* | 6/2016 | Moslehi | H01L 31/022458 | 136/244 |
| 2016/0245016 A1* | 8/2016 | Kirby | H01L 31/03928 | |
| 2017/0204658 A1* | 7/2017 | Kin | E06B 9/36 | |
| 2017/0359016 A1* | 12/2017 | Kim | H02S 30/20 | |
| 2018/0013023 A1* | 1/2018 | Moslehi | H01L 31/0682 | |
| 2018/0195766 A1* | 7/2018 | Cheun | H02S 30/20 | |
| 2018/0204967 A1* | 7/2018 | Hall | H01L 31/048 | |
| 2018/0320382 A1* | 11/2018 | De Ridder | H02S 20/10 | |
| 2018/0363366 A1* | 12/2018 | Ammerlaan | E06B 9/262 | |
| 2019/0048656 A1* | 2/2019 | Combee | E06B 9/38 | |
| 2019/0081589 A1* | 3/2019 | Woo | H01L 31/0475 | |
| 2020/0018114 A1* | 1/2020 | Yeom | E06B 9/28 | |
| 2021/0215396 A1* | 7/2021 | Moslehi | H02S 30/20 | |

* cited by examiner

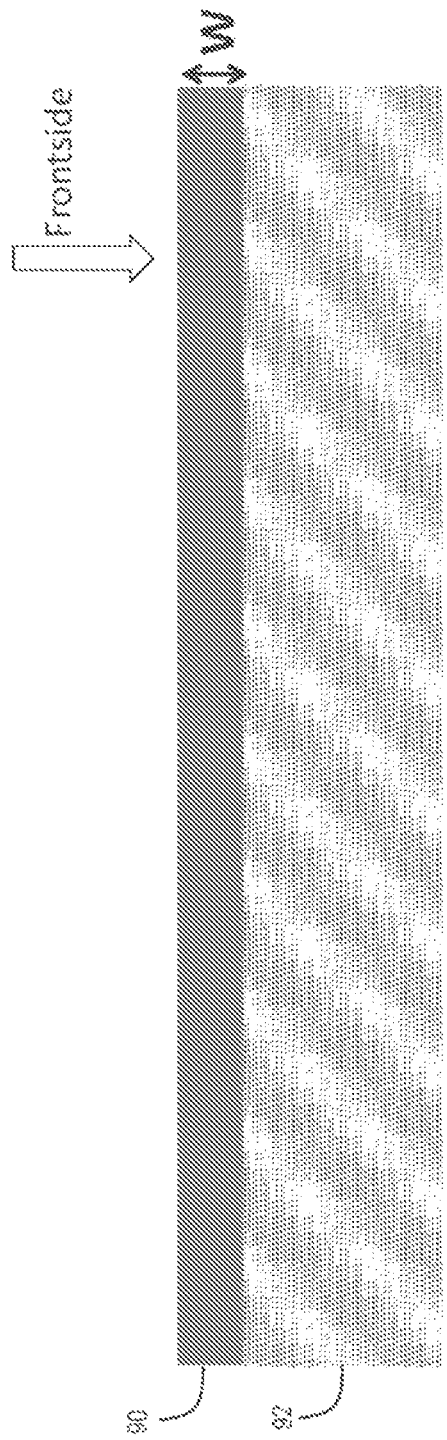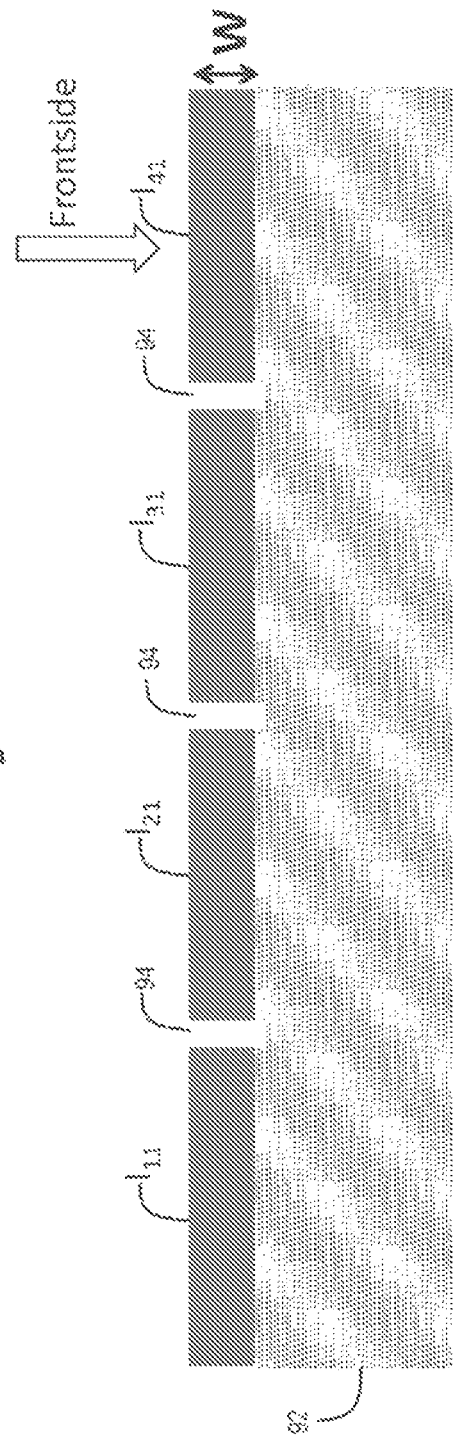

SOLAR PHOTOVOLTAIC BLINDS AND CURTAINS FOR RESIDENTIAL AND COMMERCIAL BUILDINGS

CROSS-REFERENCE TO RELATED APPLICATIONS

This application is a Continuation of U.S. application Ser. No. 17/074,480, filed Oct. 19, 2020, which is a Continuation of U.S. application Ser. No. 14/275,869, filed May 12, 2014, which claims the benefit of U.S. provisional app. No. 61/822,426 filed May 12, 2013, all of which are hereby incorporated by reference in their entirety.

FIELD OF THE INVENTION

The present disclosure relates in general to the field of solar photovoltaic (PV) cells, and more particularly to solar photovoltaic blind and curtain systems applicable to various residential and commercial buildings.

BACKGROUND

Generally, blinds and/or curtains are used to block and/or obscure light from entering a room (and/or the room light from leaving a room and be observed from outside). Blind or curtain systems may be adjustable, non-adjustable, or utilize a combination of adjustable and non-adjustable components to deflect and/or block external light. Typically, adjustable blinds are made of horizontally or vertically positioned slats (e.g., fabric, wood, plastic, metal, composite material, or another suitable material) that can be adjusted by rotating or re-positioning from open to closed positions where slats may overlap (or be proximate to each other) to substantially prevent external light from entering the room. Horizontal blind designs often use a thin woven "ladder" system to suspend the horizontal slats and the slats may be closed via a handle or a rotating drum to which each upper end of the woven ladder is wrapped and attached. Lift cords may be used to pull up the blind and stack to top of window when desired.

Vertical blind designs often utilize wider slats and a pull cord may be used to stack the slats together to one side or to separate in the center and stack on each end of the window (or door). Additionally, vertical blinds may rotate slats by rotating shaft in the upper head rail housing which runs through independent geared carriers that convert twisting of tilt rail to a synchronized rotation of each individual slat.

And while a number of solar blind systems for capturing external sunlight using conventional solar cells attached to blind slats have been proposed, these systems suffer from serious efficiency and power harvest problems relating to variable sunlight reception as well as not being capable of power generation from interior light sources (e.g., daylight inside the room and/or light from interior lighting sources). Various solar blind systems have been designed to enhance sunlight reception, for example by monitoring sunlight reception and adjusting shade angle accordingly.

Additionally, known power harvesting systems for generating electricity from external sunlight through transparent/see-through glass plate windows and doors also include special PY-generating see-through glass panels as well as building integrated photovoltaic (BIPV) glass products (for windows, skylights, and glass doors) using crystalline silicon cells mounted on sheets of glass, typically with spaces between the crystalline silicon solar cells to allow some level of light transmission. Alternatively, the BIPV glass products may be made of semi-transparent thin film PV such as amorphous silicon or copper-indium-gallium-selenide (CIGS).

BRIEF SUMMARY OF THE INVENTION

Therefore, a need has arisen for simple-to-implement high-efficiency solar PV blinds and curtains. In accordance with the disclosed subject matter, solar PV blinds and curtains slats utilizing distributed maximum power point tracking are provided which substantially eliminate or reduce disadvantages associated with previously developed solar PV blinds and curtains.

According to one aspect of the disclosed subject matter, solar photovoltaic window blind slats for power generation from internal and external light sources are provided. A plurality of solar cells are attached to at least two sides of a slat core. Distributed maximum power point tracking optimizer components are associated with each solar cell. The solar cells and corresponding distributed maximum power point tracking optimizer components on each slat side are connected in series.

These and other aspects of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGUREs and detailed description. It is intended that all such additional systems, methods, features and advantages that are included within this description, be within the scope of any claims.

BRIEF DESCRIPTION OF THE DRAWINGS

The features, natures, and advantages of the disclosed subject matter may become more apparent from the detailed description set forth below when taken in conjunction with the drawings in which like reference numerals indicate like features and wherein:

FIGS. 19A and 19B are representative schematic cross-sectional view diagrams of a backplane-attached solar cell during different stages of solar cell processing;

DETAILED DESCRIPTION

Figure 1A:
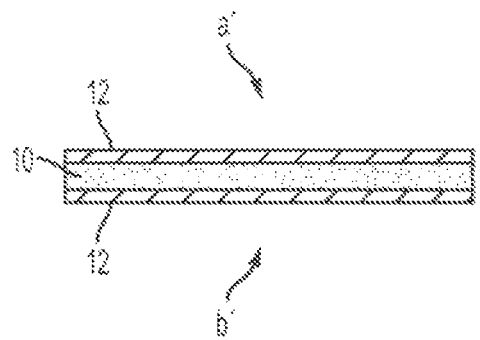
FIGS. 1A through 1E are cross-sectional diagrams of exemplary solar blind slat designs.
Figure 1B:
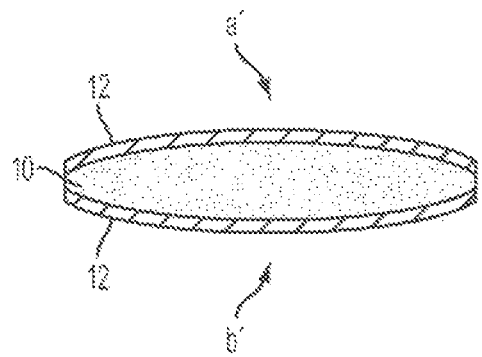
Figure 1C:
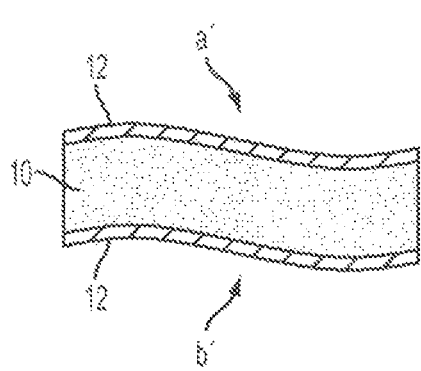
Figure 1D:
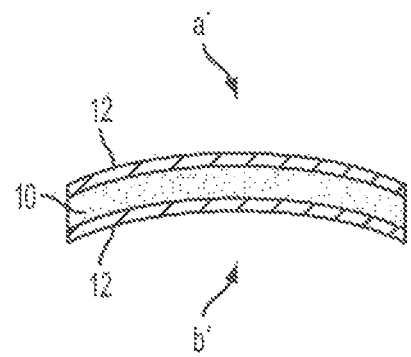

The following description is not to be taken in a limiting sense, but is made for the purpose of describing the general principles of the present disclosure. The scope of the present disclosure should be determined with reference to the claims. Exemplary embodiments of the present disclosure are illustrated in the drawings, like numbers being used to refer to like and corresponding parts of the various drawings.

The present application provides a solar photovoltaic (PV) blind (and curtain) solution, applicable to various residential and commercial buildings, for effectively and efficiently harvesting electrical power from both external sunlight and internal light sources. The embodiments disclosed may leverage known window blind or curtain configurations (such as vertical or horizontal blind systems) to efficiently capture both external sunlight and internal room light from the light receiving faces of blind slats across a variety of light conditions and for open, closed, and partially opened/closed modes of the solar PV blind system. A wide range of light irradiance conditions (both external sunlight and internal light, artificial or diffused daylight) with any variability and/or non-uniformity due to environmental factors or the position/angle of the slats themselves can be utilized and maximum available power is harvested using high efficiency solar cell structures and distributed cell level maximum power point tracking (MPPT) power optimization and shade management electronics. An advantage of the solutions disclosed herein is that these solar blinds and curtains may be used in all existing buildings without the need to replace the glass windows and glass doors to make them compatible with PV power generation. In contrast, solar glass requires replacement of existing building glass windows and/or doors to install the solar PV glass windows and/or doors. The PV blinds provided herein turn existing glass windows and glass doors to solar PV windows and doors, generating electricity from both outdoor and indoor light sources and thus may be applied to existing residential and commercial buildings as well as new residential and commercial building constructions.

And although the present disclosure is described with reference to specific solar cell embodiments and electronics components, such as a interdigitated back-contact (IBC) back-junction solar cell, one skilled in the art could apply the principles discussed herein to other solar cell structures, components, and materials (such backplane materials, slat core materials, and solar cell absorber and metallization materials), technical areas, and/or embodiments without undue experimentation. Further, although the embodiments are described with reference using known window (and door) blind structures and terms, innovative aspects of the disclosed subject matter may be applied to other light deflectance or blocking systems (e.g., curtains, awnings) or any apparatus receiving light from at least two separate light sources.

The photovoltaic blind and curtain solutions of the present application capture external sunlight (and/or diffuse daylight) and internal building light (from incoming daylight and/or internal light sources) using multifaceted (and in some cases cylindrical or elliptical) light receiving solar slats. These solutions may be applied as blinds in commercial, industrial, and residential buildings, integrated with known blind systems, or otherwise applied as building integrated photovoltaic (BIPV) solar curtains and blinds utilizing photovoltaic solar cells to harvest both indoor and outdoor light through and in conjunction with glass (or otherwise transparent) windows and doors in residential and commercial buildings and structures. Importantly, the multi-faceted solar PV slats disclosed herein may be applied in any system to leverage light reception from two light sources (or from two light directions) or a changing light source (e.g., a permanent vertical solar fixture receiving morning and oppositely directed evening sunlight).

Further, U.S. Pat. Pub. No. 2014/0060610 published Mar. 6, 2014 and commonly owned U.S. patent application Ser. No. 14/072,759 filed Nov. 5, 2013 and Ser. No. 14/452,776 filed Apr. 14, 2014 are hereby incorporated by reference in their entirety.

The solar PV blind slats disclosed herein may be utilized consistent with the aforementioned brief description and general widely known use of blind slats to transform these household elements from passive sun blockers to active power generators. Novel photovoltaic solar blind structures are provided— in some instances the cells themselves self-supporting slats and alternatively solar cells positioned on and attached to slats (e.g., solar cells laminated to or mounted on a slat/slat core)— which efficiently capture and harvest both indoor room light and external sunlight (or external diffuse daylight). Additionally, these solar cells may be flexible and conform to nonplanar slat curvature or topography.

FIGS. 1A through 1E are cross-sectional schematic diagrams of exemplary solar blind slat designs. Solar cells 12 cover most or all of the primary light receiving surfaces of slat core 10 of slat designs in FIGS. 1A through 1E depicting various solar PV blind shapes— in other words, solar cells cover essentially all or most of the light receiving (or available) surface areas of the slats (for example both primary sides in a traditional blind slat). FIG. 1A shows a planar slat design (e.g., with a rectangular core cross-section), FIG. 1B a curved convex (i.e., elliptical prism) design, FIG. 1C a curved design, FIG. 1D a curved concave design, and FIG. 1E a circular prism design (e.g., hollow tube or solid rod shaped). The blind slats of FIGS. 1A through 1D have two primary light receiving sides a' and b' which are covered by conformal solar cells 12. Thus, both sides of the slat are covered with solar cells for maximum power harvest from outdoor light and indoor light sources. In some instances, flexible solar cells conform and cover curved areas on both sides of the blind, such as in the slat designs shown in FIGS. 1B through 1E— in other words, the solar cell absorber conformally attaches to a curved slat core. The solar cells may be laminated or otherwise conformally mounted to the curved slat core. These curved light receiving slat surface areas are covered or tiled with (semi)-flexible, high-efficiency solar cells (e.g., back-contact solar cells) to harvest and convert available indoor (room) and outdoor light irradiance to electricity.

Figure 1E:
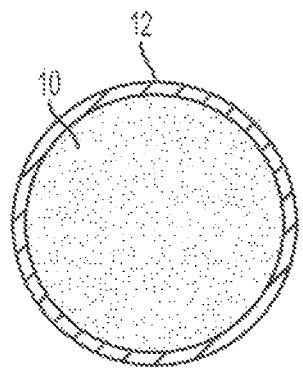

A single flexible solar cell (e.g., a 156 mm×156 mm standard sized crystalline silicon solar cell) may wrap around the circumference of the circular prism slat design of FIG. 1E or a plurality of cells (such as two solar cells) may be used to wrap around a majority or all of the peripheral surface area of the slat design of FIG. 1E. In the circular slat design of FIG. 1E, the cells may be positioned inside a protective tube to form a circular prism slat design (if using an optically transparent tube) or conformally attached to the outer peripheral sidewall of a circular prism slat core. The photovoltaic solar blinds as described herein may utilize flexible or semi-flexible thin crystalline semiconductor solar cells, for example those based on ultrathin monocrystalline silicon, or alternatively may utilize absorber layers such as GaAs, CIGS, or CdTe.

The solar curtains and blinds disclosed herein may be used as window and door covers (for example indoors/interior blinds not exposed to exterior weather conditions) to produce electricity from both exterior sunlight/daylight and interior light (e.g., diffuse daylight inside the room, artificial light such as incandescent bulbs, fluorescent lights, halogen lights, etc.). Thus, the solar blinds absorb outdoor light (e.g., external sunlight and diffuse daylight through a window glass) as well as indoor light such as the interior daylight as well as artificial room light (e.g., light bulbs) and/or reflected external sunlight. Moreover as discussed, the solar PV blind solutions provided herein may be integrated into existing buildings without a need to change or replace any of the windows and doors for electricity generation. In other words, an advantage of the solution provided herein allows for the use and retrofitting of readily changeable features such as blinds to generate PV energy inside a building while utilizing existing building infrastructure.

Figure 2A:
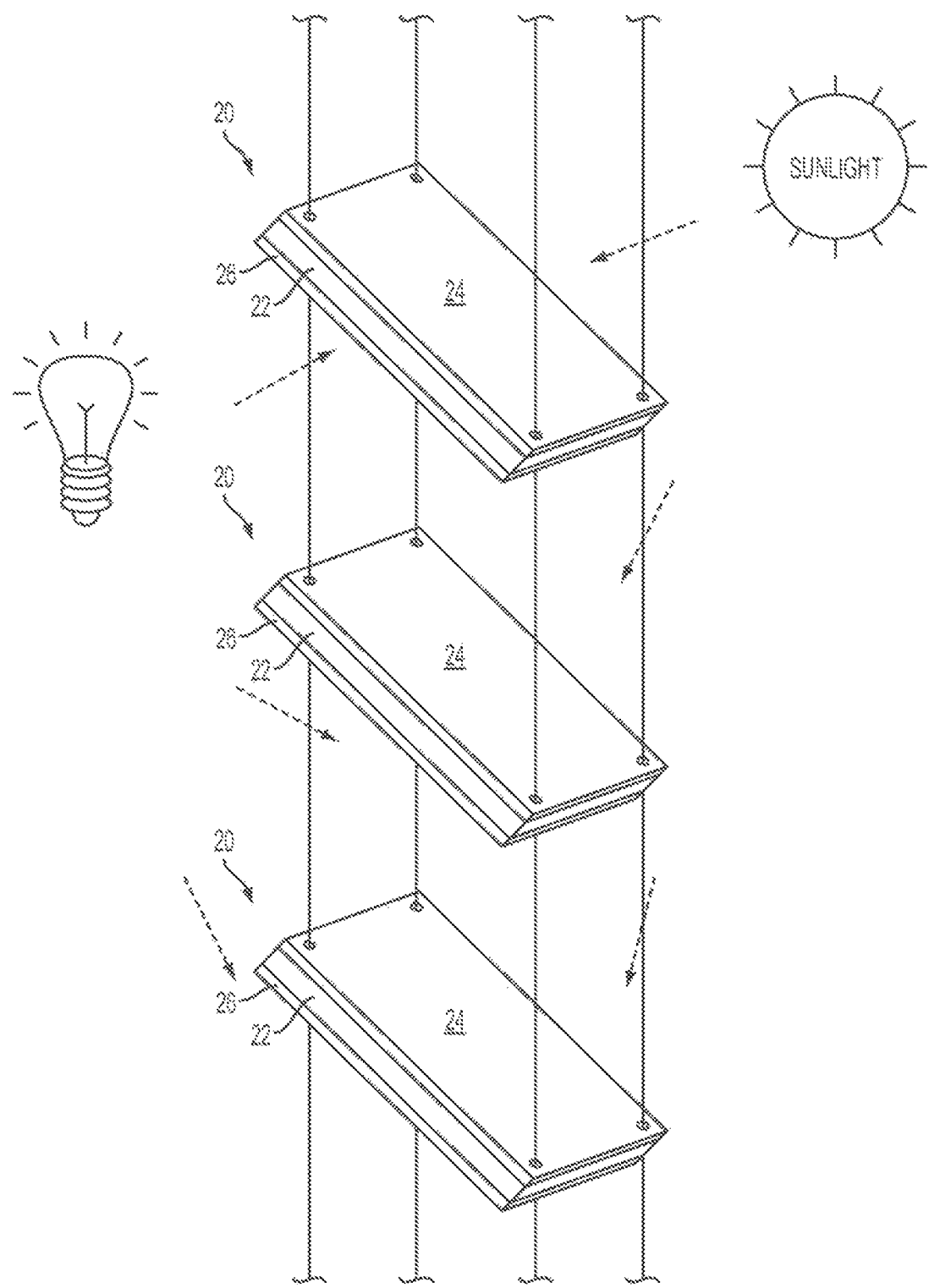
FIGS. 2A and 2B are diagrams of a horizontal blind system of solar blind slats 20 in partially open and closed positions.
Figure 2B:
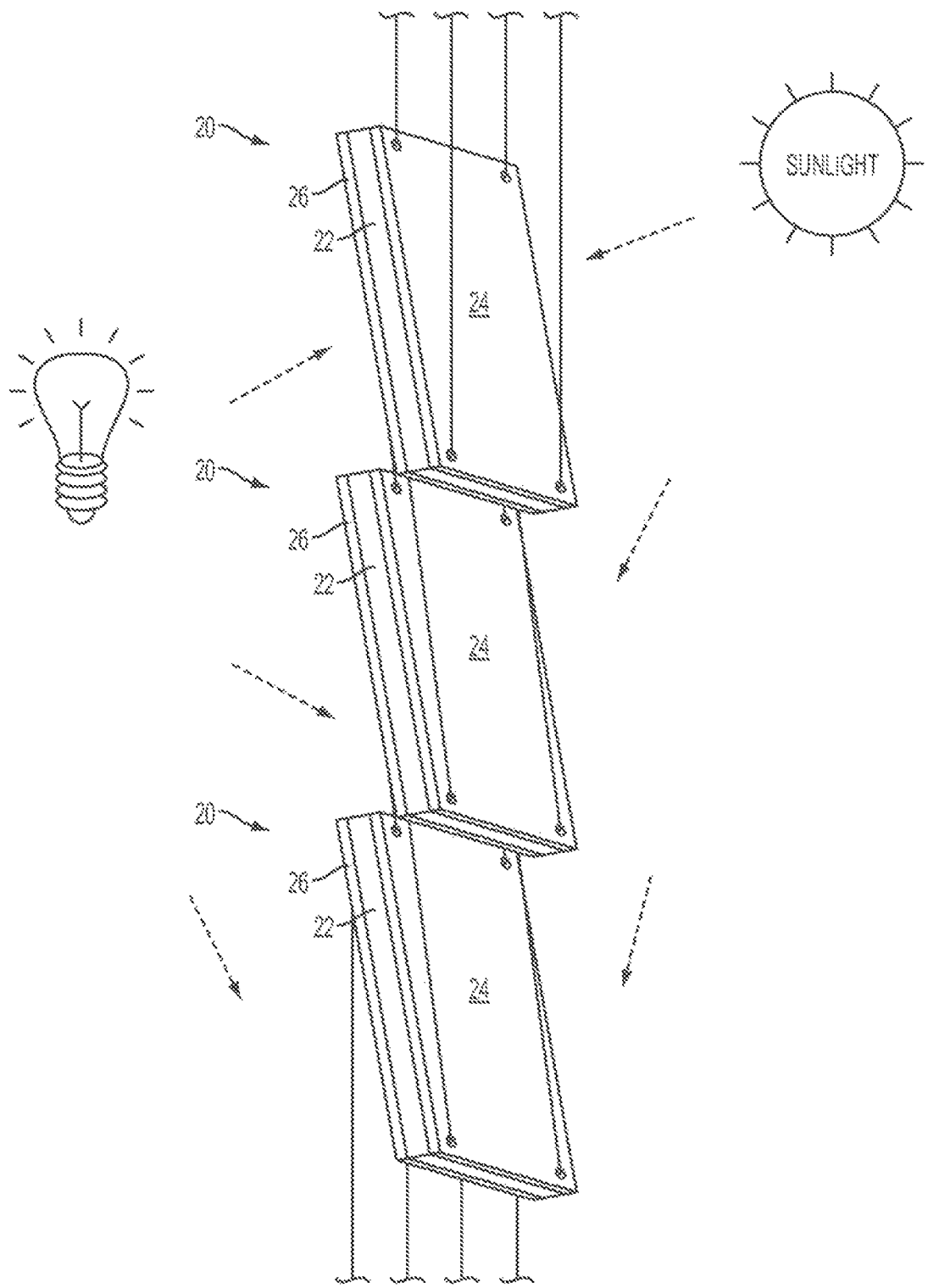

FIGS. 2A and 2B are diagrams of a horizontal blind system of solar blind slats 20 in partially open and closed positions, respectively, in accordance with the disclosed subject matter (fully open position not shown). Solar cells 24 and solar cells 26 are positioned/attached to slat core 22 to form solar blind slat 20 similar to the planar slat design shown in FIG. 1A in FIGS. 2A and 2B (although any slat design may be used, e.g., curved, cylindrical, etc.). Importantly, solar cells facing the interior of the buildings collect ambient light in a variety of blind positions. When a blind is in the closed position, such as that shown in FIG. 2B, cells on one side of the slats absorb indoor light (shown as solar cells 26 in FIGS. 2A and 2B) and cells on the opposite slat side absorb light from the outdoors (shown as solar cells 24 in FIGS. 2A and 2B). When a blind is in the open (not shown) or partially open position, such as that shown in FIG. 2A, cells on both sides of the slats absorb light from both indoors and outdoors— in other words, cells 24 and 26 absorb and harvest both interior and exterior light irradiance.

Figure 3A:
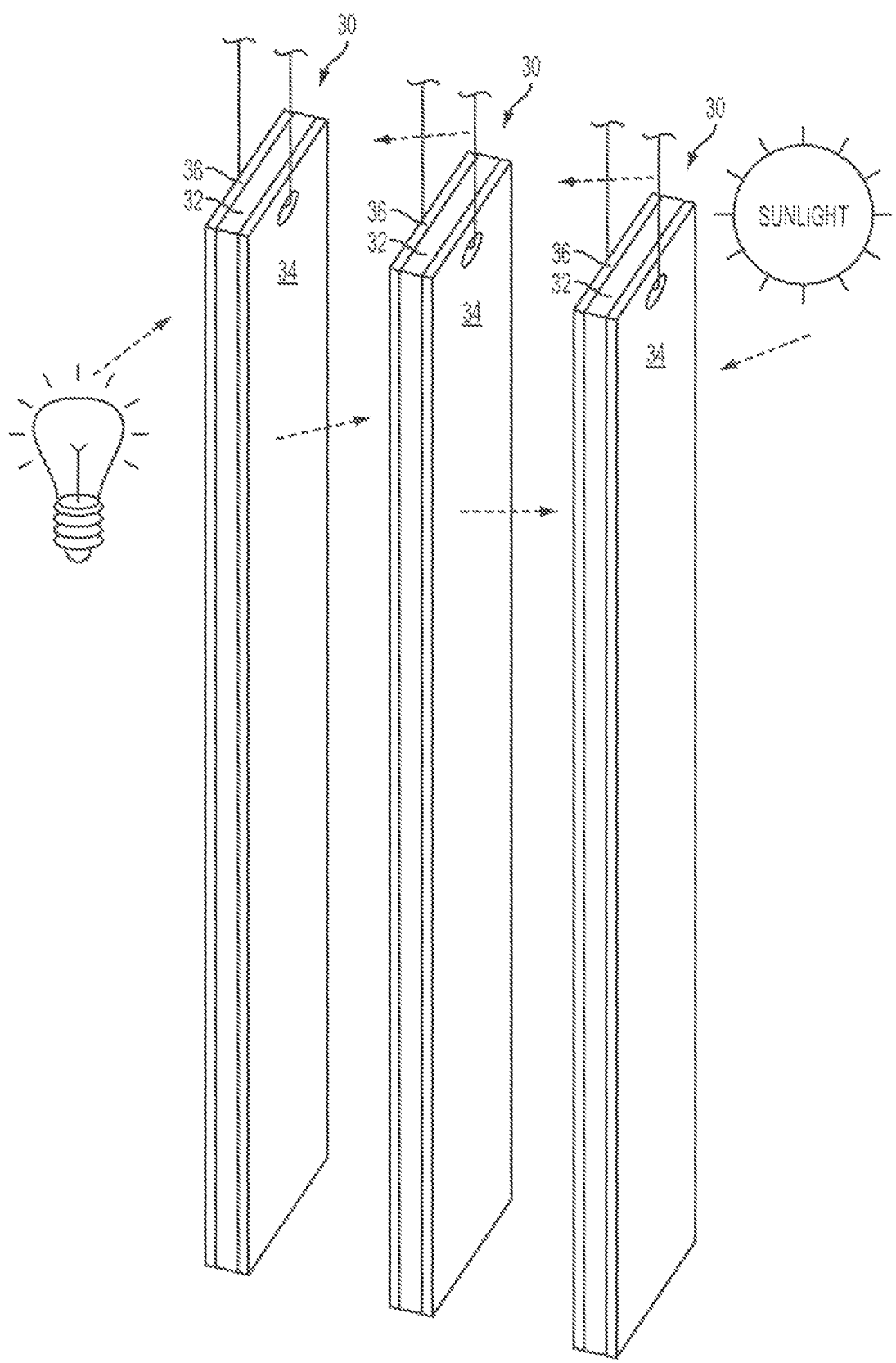
FIGS. 3A and 3B are diagrams of a vertical blind system of solar blind slats 30 in partially open and closed positions.
Figure 3B:
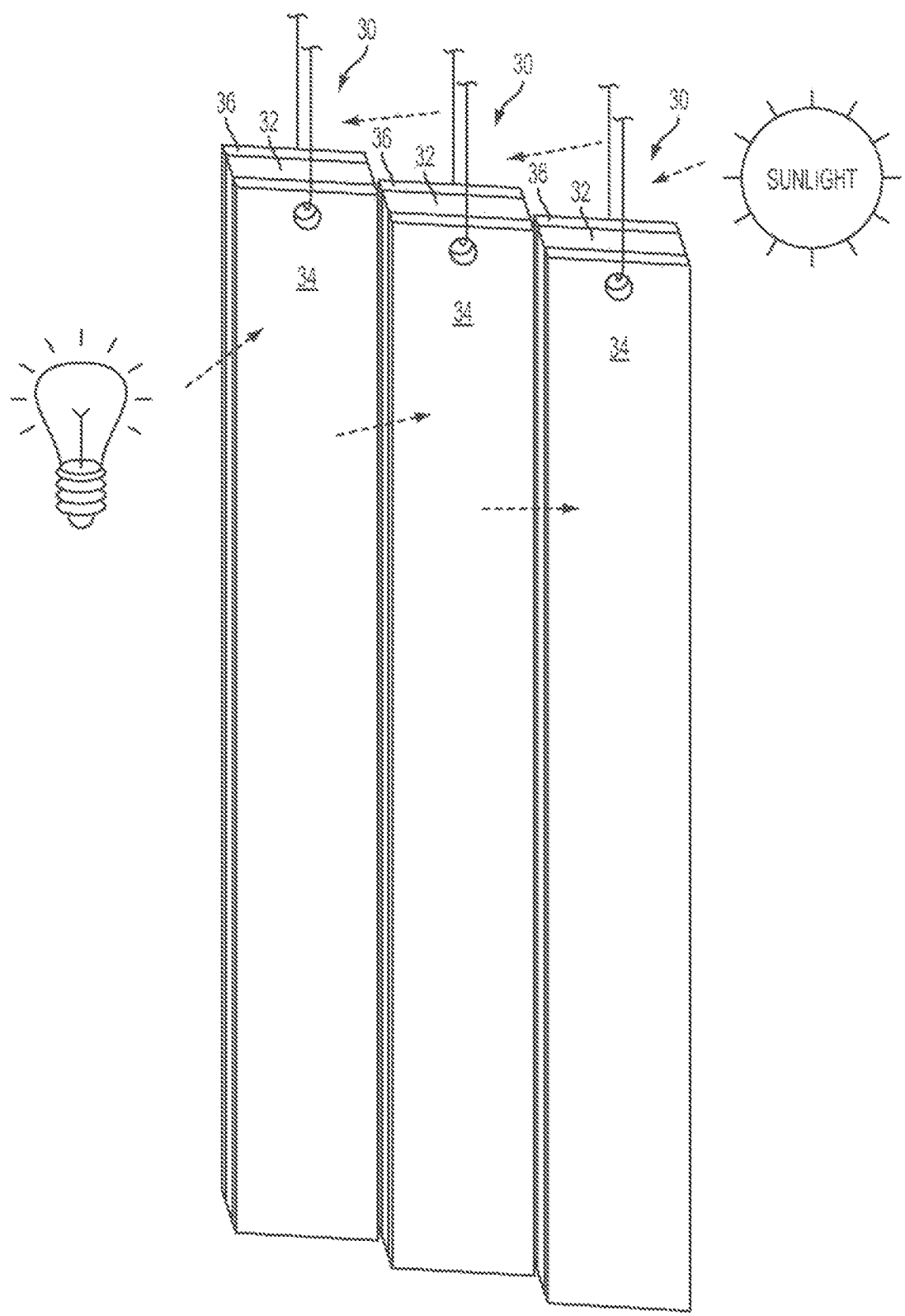

FIGS. 3A and 3B are diagrams of a vertical blind system of solar blind slats 30 in partially open and closed positions, respectively, in accordance with the disclosed subject matter (fully open position not shown) and similar to the solar blind slats of FIGS. 2A and 2B (although any slat design may be used, e.g., curved, cylindrical). Solar cells 34 and solar cells 36 are positioned/attached to slat core 32 to form solar blind slat 30 similar to the planar slat design shown in FIG. 1A in FIGS. 3A and 3B. Importantly, in this vertical blind design as in the horizontal solar blind design, solar cells facing the interior of the buildings collect ambient light in a variety of blind positions. When a blind is in the closed position, such as that shown in FIG. 3B, cells on one side of the slats absorb indoor light (shown as solar cells 36 in FIGS. 3A and 3B) and cells on the opposite slat side absorb light from the outdoors (shown as solar cells 34 in FIGS. 3A and 3B). When a blind is in the open (not shown) or partially open position, such as that shown in FIG. 3A, cells on both sides of the slats absorb and harvest light from both indoors and outdoors— in other words, cells 34 and 36 absorb and harvest both interior and exterior light to generate electricity from all available light sources.

In some instances, an optimal blind position may be used to harvest maximum power at a given time of the day and season. Optionally, a device which monitors solar cell power generation as a function of the blind position may fitted to the solar blind system to adjust the blinds to the maximum power generation blind position setting.

The solar PV blind slats disclosed herein may be utilized consistent with the aforementioned brief description and general widely known use of blind slats to transform these household elements from passive sun blockers to active electrical power generators. Novel photovoltaic solar blind structures are provided— in some instances the solar cells themselves serve as self-supporting slats and alternatively solar cells positioned on and attached to slats—which efficiently capture and harvest both indoor room light and external sunlight.

Additionally, these solar cells may be flexible and conform to non-planarity and variations in slat curvature or topography. The solar blinds of the present application may utilize high efficiency crystalline silicon solar cells which are somewhat flexible or semi-flexible (i.e., no cell breakage upon flexing or bending) such that they may tolerate, and conformally cover, pre-formed curvatures of the slat core. In one embodiment, this flexibility or semi-flexibility may be achieved using thin crystalline silicon solar cells (e.g., having an absorber thickness in the range of a few to a hundred microns) as thin silicon currently provides advantages relating to efficiency, flexibility, cost, and safe/reliable material attributes as a solar cell absorber. Importantly, other thin semiconductor materials, such as GaAs, may also allow for slat curvature.

Back-contact back junction solar cell architectures having light unobstructive metallization (i.e., metal lines not obstructing the path of absorbed light) may be particularly advantageous for cell interconnection and blind aesthetic designs (no metallization on the light-receiving side of the solar cell). Although, for example, front contacted cells with relatively high efficiencies such as those made with GaAs and other direct bandgap absorbers may also be used. In one embodiment, flexible high-efficiency back-contact thin crystalline semiconductor solar cells form, or are otherwise integrated with, blind slats for BIPV applications. For example, square or pseudo-square high-efficiency (e.g. Standard Test Condition or STC solar efficiency greater than about 18%) back contact crystalline solar cells (e.g., full square or pseudo square format 156 mm by 156 mm solar cells) may be used to form the window blind slats. The light receiving surface areas of the blinds may be covered such that all or most of the light (indoor and outdoor) receiving surface areas of the slats are covered or tiled with flexible or semi-flexible (i.e. no cell breakage upon bending or conforming to a curved surface), high-efficiency solar cells (e.g., back-contact solar cells) to harvest and convert indoor (room) and outdoor light to electricity.

Further, high efficiency solar cells, particularly back contacted solar cells may utilize distributed power electronics to enhance the power harvest performance of the PV slats under non-ideal and non-uniform light irradiance conditions.

In some cases, dependent on blind slat position as well as light levels (both indoor and outdoor irradiance levels), low light levels may lead to decreased power generation on a solar cell individually, a combination of cells, or across the cells on a slat side/face. Dynamically adjustable maximum power point tracking (MPPT) electronics components corresponding to each solar cell or parallel connected (or series-connected) solar cells on a slat provide enhanced power harvesting through maximum power harvesting in variable or highly varying incidence light environments which may be caused by changes in position of slats and ambient lighting as well as variable shading conditions. Each cell may have a Maximum-Power-Point Tracking (MPPT) power optimizer electronics component embedded on a backplane attached to the backside of the solar cell. Further, each cell may have an integrated bypass switch such as a bypass diode for distributed shade management and to maximize the energy yield of the solar PV blind. In some instances, the MPPT power optimizer electronics and the bypass switch may be integrated into the same component package.

The solar cells may be covered and protected by a flexible, transparent cover made of a suitable material such as transparent flouropolymer (e.g., ETFE or PFE) attached to the frontside of solar cells using an encapsulant layer and may be mounted onto the slats using a suitable encapsulant material such as EVA (ethylene vinyl acetate) or polyolefin or another encapsulant. The slats may also be made of an encapsulant such as EVA and in some instances integrated with a cell backplane made of a material such as a prepreg material sheet.

Figure 4:
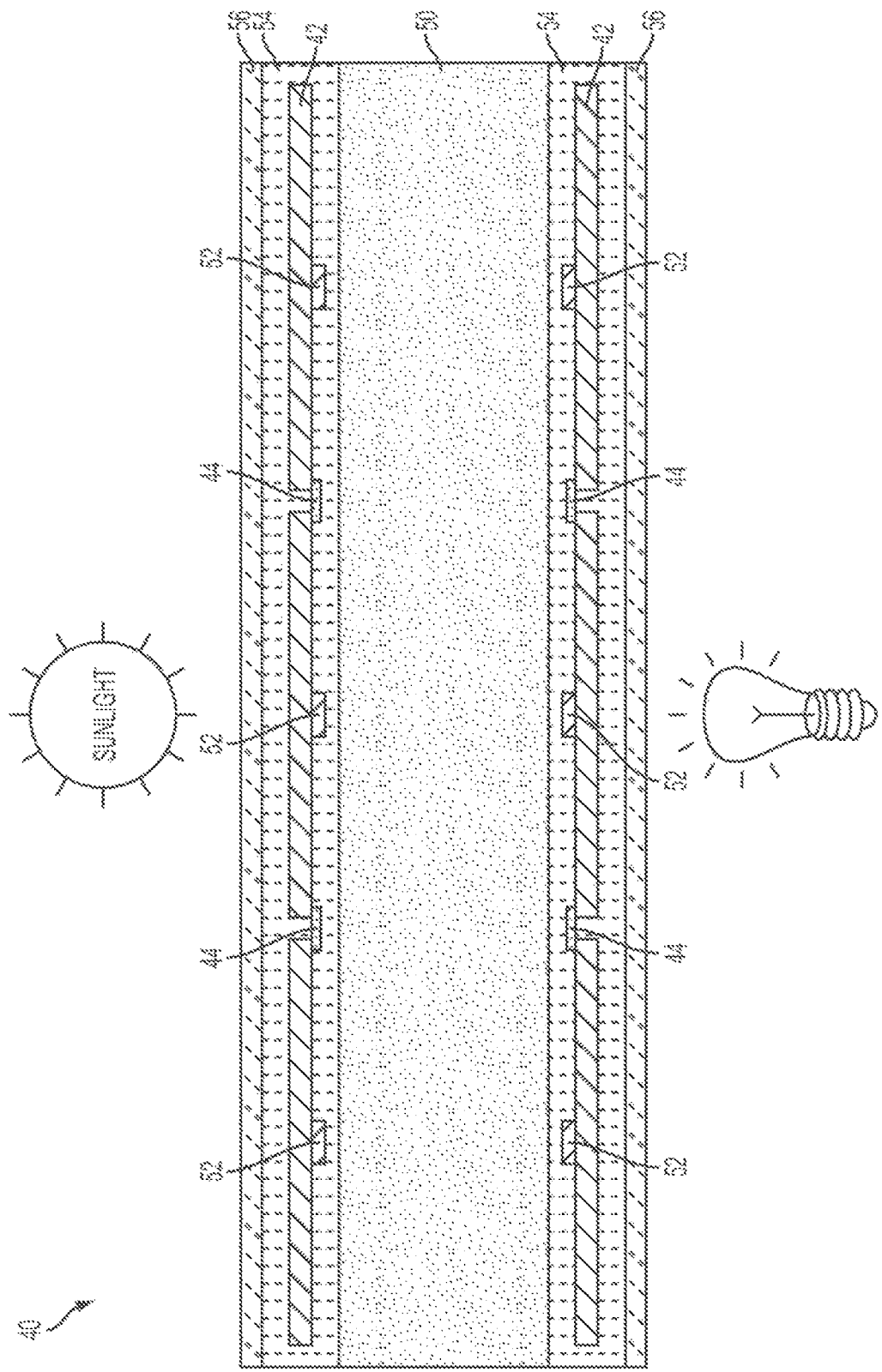
FIGS. 4 through 6 are cross-sectional diagrams of solar blind slats in accordance with the disclosed subject matter.
Figure 5:
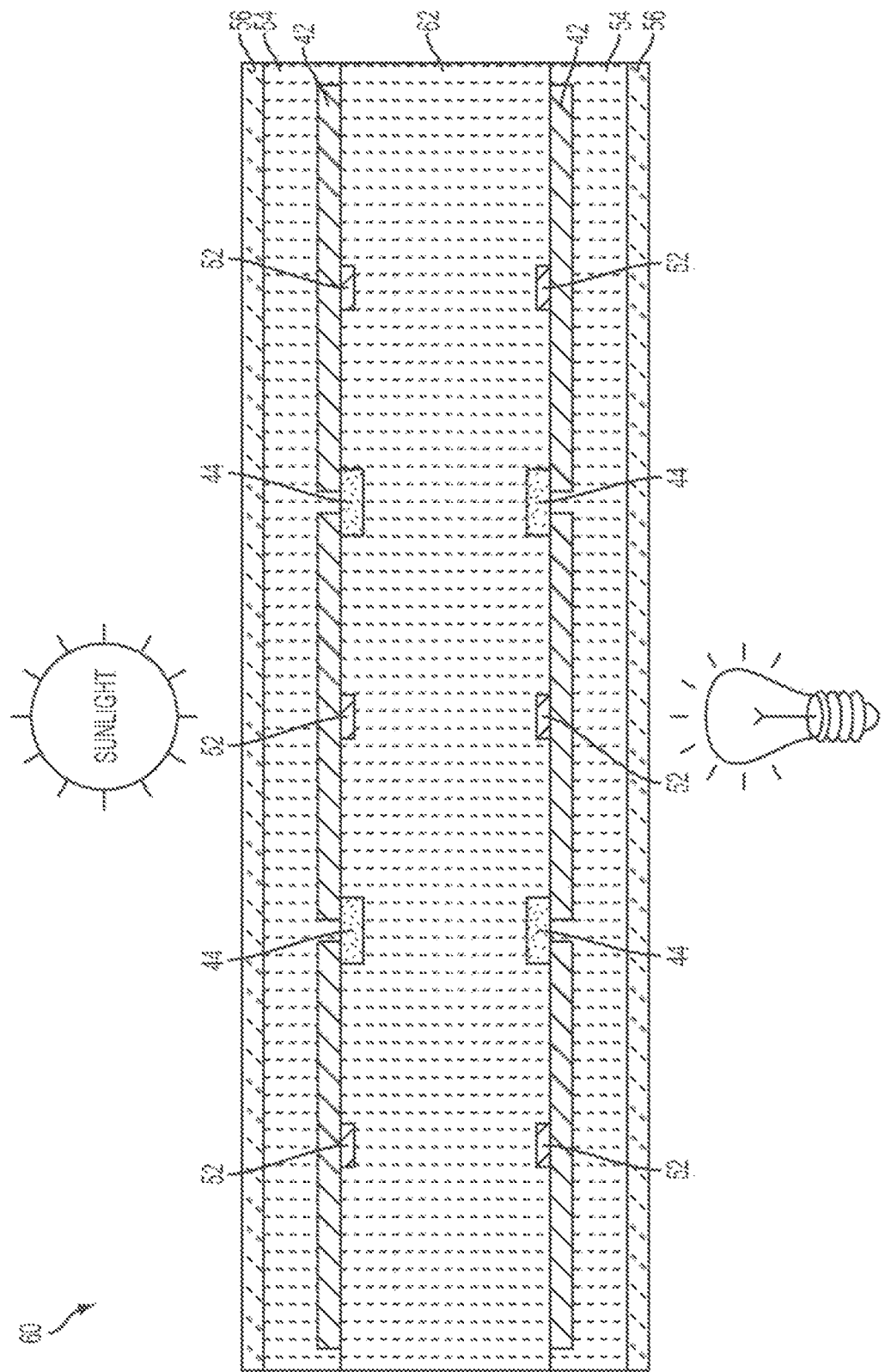
Figure 6:
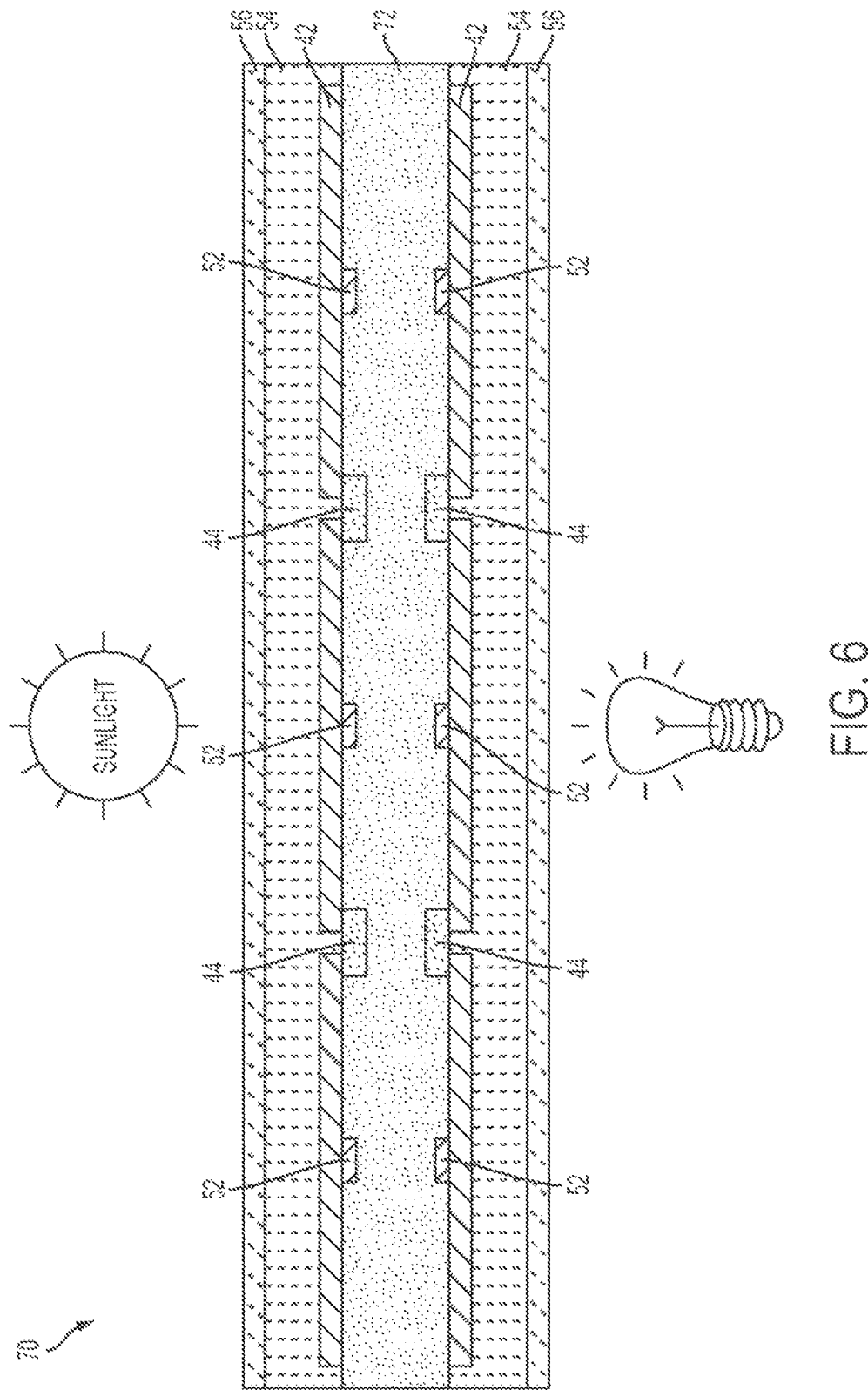

FIGS. 4 through 6 are cross-sectional diagrams of solar blind slats in accordance with the disclosed subject matter and showing various slat core and solar cell integration embodiments. FIG. 4 is a cross-sectional diagram showing back contact solar cells on both sides of a blind slat (e.g., back contact cells mounted on or laminated to a slat core). As shown in FIG. 4, flexible backplane supported solar cells 42 are positioned on both sides of slat core 50 with the cell light absorbing side (i.e., so-called cell sunnyside) positioned outward away from the slat core to receive light. Encapsulant 54 (e.g., EVA, PV-FS Z68, or polyolefin or an alternative suitable PV encapsulant sheet) and transparent cover 56 (e.g., ETFE, PFE, or alternative transparent flouropolymer, or a flexible thin glass cover) protects solar cells 42. Cell connection tabs 44 provide cell to cell interconnection (shown as series connection between cells on the same slat side) and distributed cell MPPT power optimizers and bypass switches 52 provide enhanced power harvest or maximum cell power generation. As shown in FIG. 4, slat core 50 may be a different material from encapsulant 54—for example the slat core may be any window blind slat material such as wood, plastic, metal, composite material, or a prepreg material.

FIG. 5 is a cross-sectional diagram of solar blind slat 60 similar to solar blind slat 40 of FIG. 4 except that slat core 62 is made of the same material as encapsulant 54— for example EVA or polyolefin.

FIG. 6 is a cross-sectional diagram of solar blind slat 70 similar to solar blind slat 40 of FIG. 4 except that slat core 72 is made of the same material as the cell backplane itself—for example the two series connected strings of cells on the opposite slat sides are isolated using a thin (e.g., 10 to 100 microns thick) insulating sheet material (e.g., a prepreg material, PET, PEN, or alternative insulating plastic). The backplane material, such as prepreg sheet, may be attached to the backsides of the solar cells by a vacuum-thermal lamination process.

Figure 7:
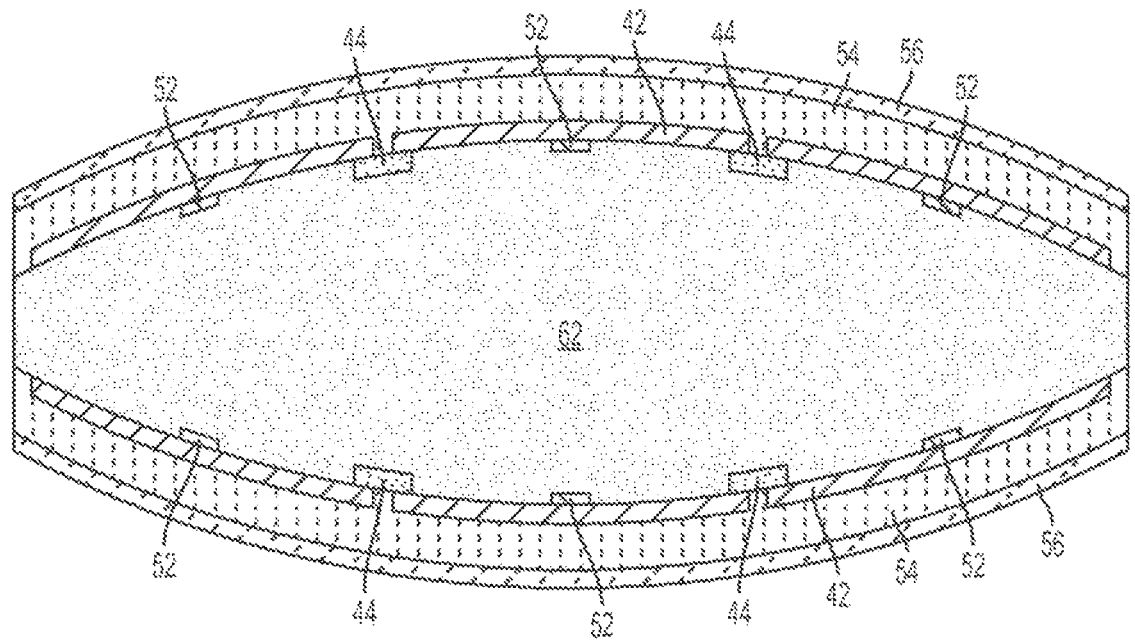
FIGS. 7 through 10 are cross-sectional diagrams of a solar blind consistent with FIG. 4 and the slat core designs of FIGS. 1B through 1E.
Figure 8:
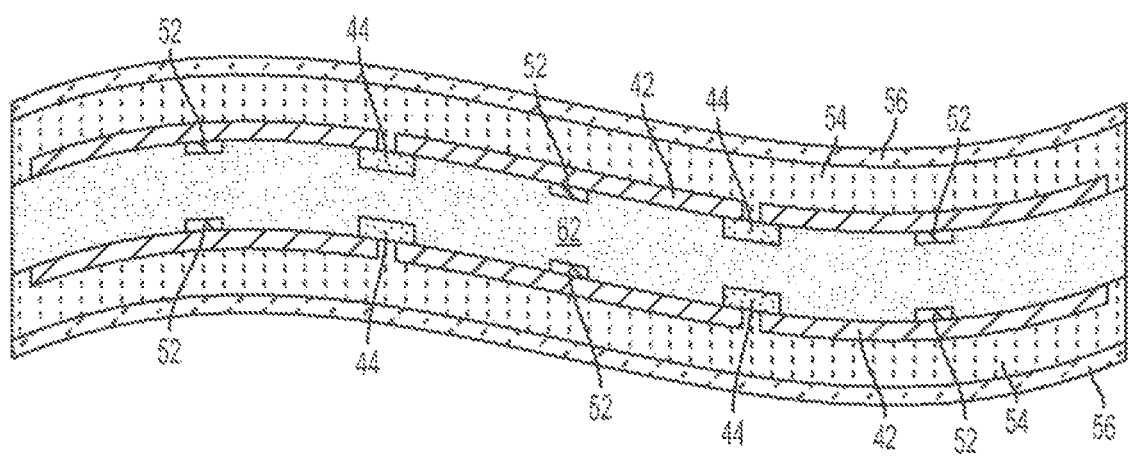
Figure 9:
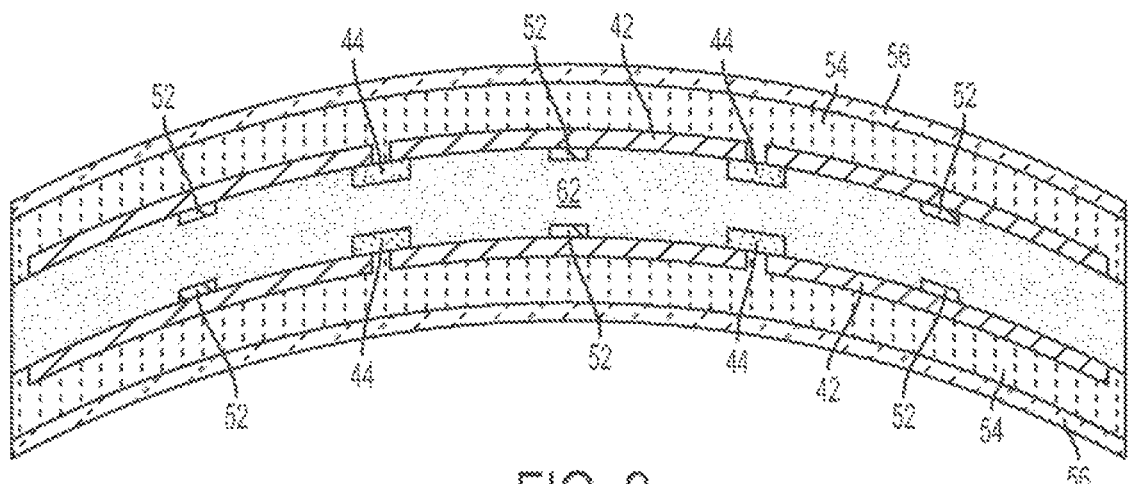
Figure 10:
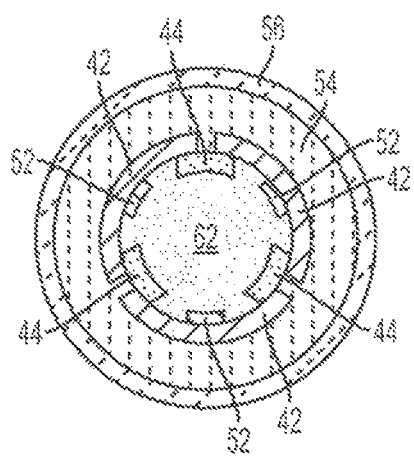

FIGS. 7 through 10 are cross-sectional diagrams of a solar blind consistent with FIG. 4 and the slat core designs of FIGS. 1B through 1E. FIG. 7 is a cross-sectional diagram of a solar blind comprising back contact solar cells and an elliptical slat design such as that shown in FIG. 1B. FIG. 8 is a cross-sectional diagram of a solar blind comprising back contact solar cells and a curved slat design such as that shown in FIG. 1C. FIG. 9 is a cross-sectional diagram of a solar blind comprising back contact solar cells and a convex slat design such as that shown in FIG. 1D. FIG. 10 is a cross-sectional diagram of a solar blind comprising back contact solar cells and a circular shaped slat design (i.e., cylindrical slat with circular cross section) such as that shown in FIG. 1E. In practice, the non-planar solar blind slats of FIGS. 7 through 10 may be formed by laminating a flexible solar cell (e.g., a back contact backplane supported solar cell) to a slat core defining the slat shape (e.g., curved, elliptical, etc.).

The solar cells on each face of a given blind slat may be connected in series as a single series string—thus, the slats shown in FIGS. 3 and 4 may comprise two strings of series connected solar cells (one string on each blind slat face). Each solar cell in each string may have an integrated bypass switch (such as a Schottky barrier rectifier diode or another suitable low-dissipation/low-voltage-drop switch) to protect the cells against partial shading and to maximize energy harvesting of the PV cells embedded in or tiled on the slats in the blind. The inner slat face cell strings may be connected together in series or in parallel (series connection advantageous for enhanced power harvest).

Similarly, the outer slat strings may be connected together in series or in parallel (series connected advantageous for enhanced power harvest). Optionally, each PV blind assembly may utilize a micro-inverter or a plurality of micro inverters or a single string inverter, and the blind electrical output from the microinverter(s) or string inverter may be plugged directly into an AC wall plug and power generated by the solar blind distributed into the building electrical grid. If the blind assembly uses two micro-inverters, each inverter may correspond to each face of the blind. Alternatively, a plurality of PV blinds may use a single multi-input string inverter.

Each slat, and in some instances each slat face, in the disclosed solar blind system is a power source and the slats in a blind system may be connected in electrical series, parallel, and various combinations of series/parallel electrical connection. Slat to slat electrical connection embodiments are shown in FIGS. 11 through 14. Slat to slat interconnection may be positioned, for example, in a blind housing in a vertical blind system, in vertical runners in a horizontal blind system, or in the blind housing in a horizontal blind system with slat to slat interconnects integrated with horizontal blind ladder support.

FIGS. 11 through 14 are functional diagrams showing the electrical interconnections between individual cells and slat to slat interconnection in a two sided blind slat design. Each solar cell has a corresponding (i.e., distributed) MPPT power optimizer and bypass switch component. For descriptive purposes, individual slat sides are shown splayed/butterflied—in other words, the solar cells shown in slat side 1 and slat side 2 of Slat 1 may be attached on opposite primary sides (such as a' and b' as described above) on a planar/curved or wrap-around solar cells in a cylindrical slat design. And although both sides of each slat are shown connected in series, alternative embodiments include only slats on the same side connected in series (i.e., each slat having two strings of cells determined by slat side).

Figure 11:
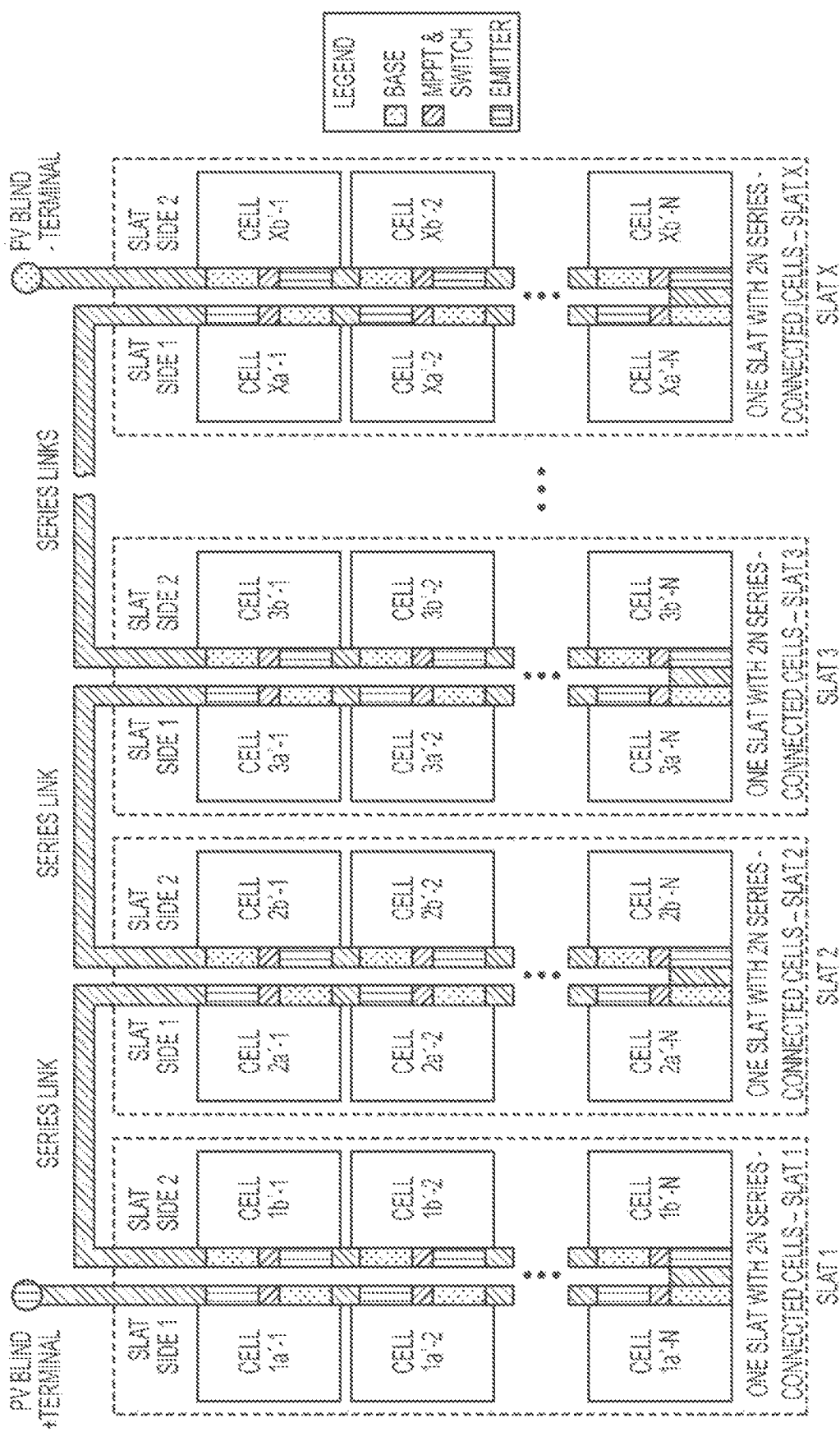
FIGS. 11 through 14 are functional diagrams showing the electrical interconnections between individual cells and slat to slat interconnection in a two sided blind slat design.
Figure 12:
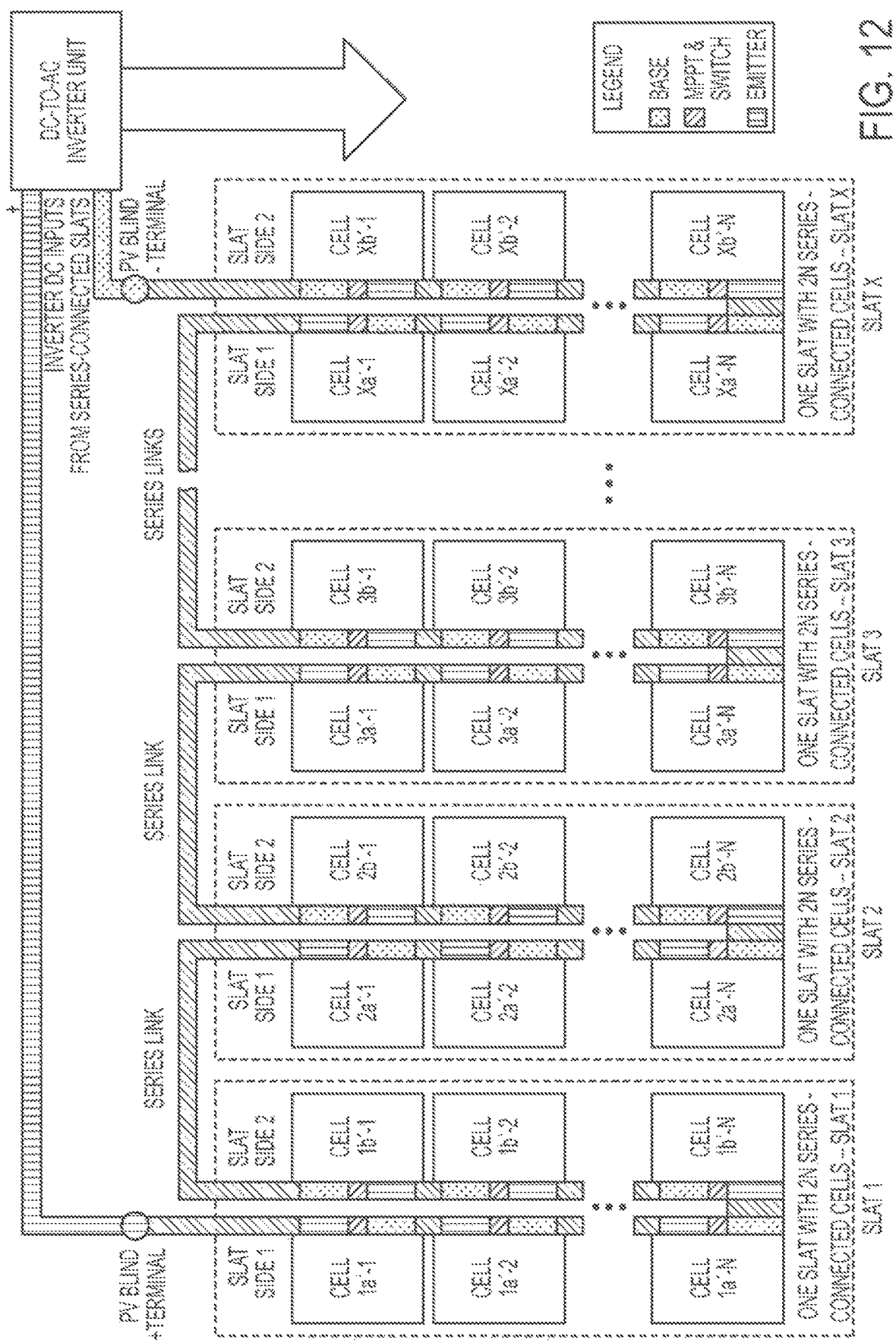
Figure 13:
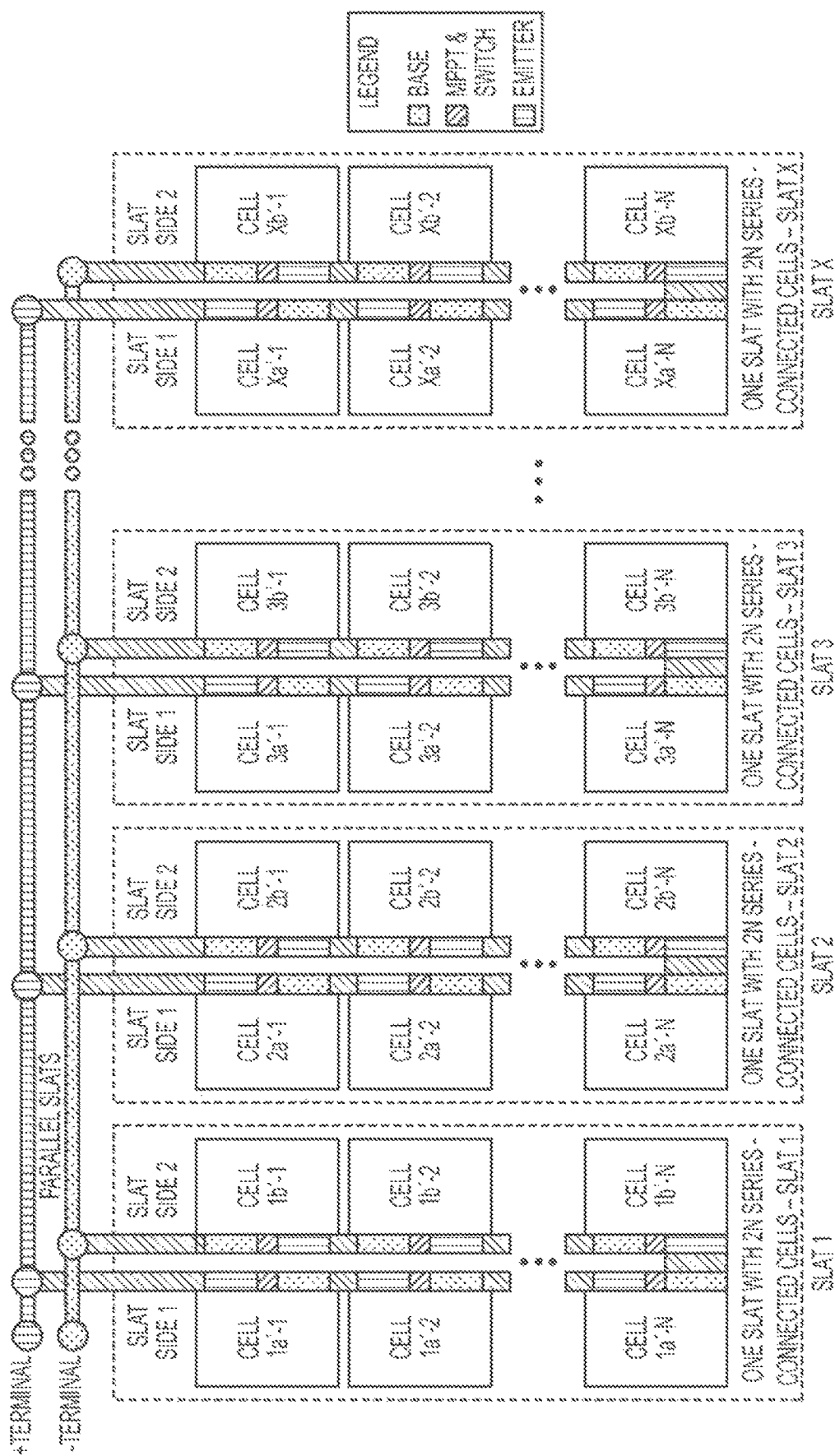
Figure 14:
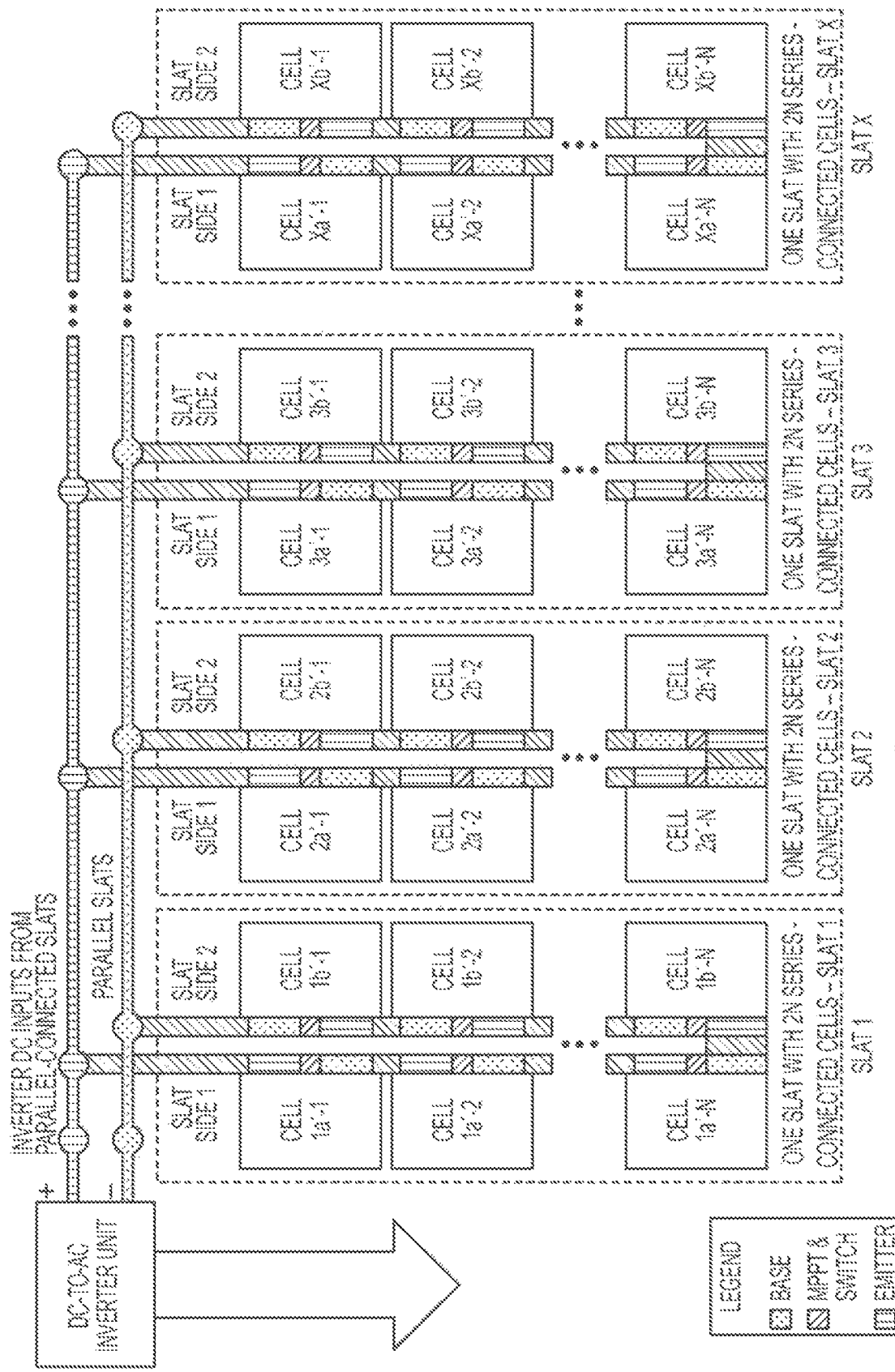

FIG. 11 is a functional diagram of a solar blind system showing all cells on each slat connected in series and all slats connected in series. FIG. 12 is a functional diagram of a solar blind system similar to that of FIG. 11 and showing all cells on each slat connected in series, all slats connected in series, and all series connected slats connected to a DC-to-AC inverter unit providing AC output for direct connection to an AC load such as an AC power line or wall plug (e.g., inverter AC output 110V/60 Hz). FIG. 13 is a functional diagram of a solar blind system showing all cells on each slat connected in electrical series and all slats connected in electrical parallel. FIG. 14 is a functional diagram of a solar blind system similar to that of FIG. 13 and showing all cells on each slat connected in electrical series, all slats connected in electrical parallel, and all parallel connected slats connected to a DC-to-AC inverter unit providing AC output for an AC load or direct connection to an AC power line or wall plug (e.g., inverter AC output 110V/60 Hz). Again, it is important to note in some instances the interconnections between slat sides may be connected in electrical parallel with each string of solar cells on a slat side on each slat (e.g., two slat sides and two corresponding solar cell strings) operating as a power generator.

Figure 15:
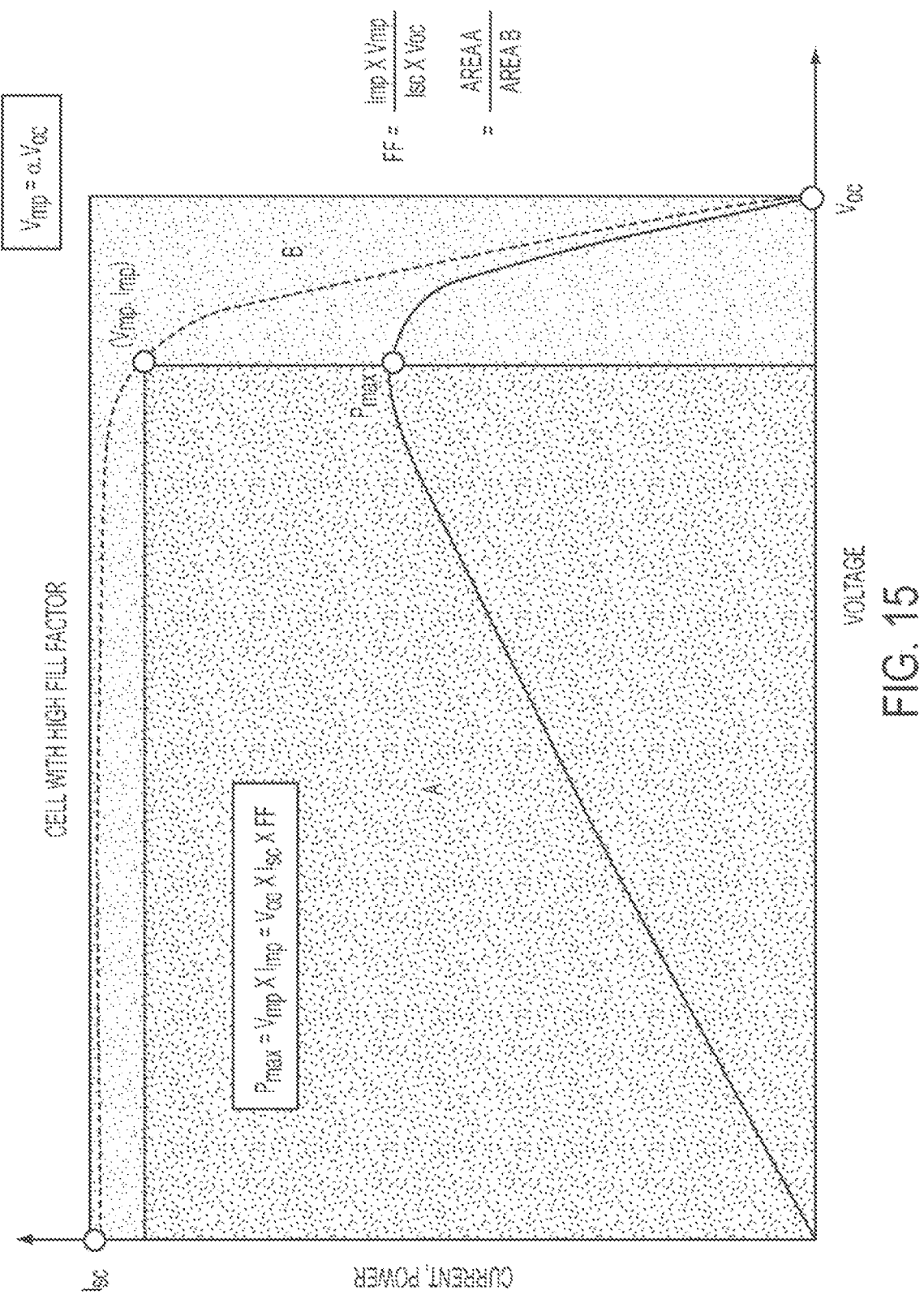
FIG. 15 is a graph showing solar cell IV characteristics and Maximum Power Point (MPP) for maximum power harvesting at a given illumination.

Due to variable shading, the effects of diffuse light, low irradiance, blind slat position, or any number of factors (e.g., the disparity between internal light and external light and vice versa) which may limit or reduce solar cell electrical power generation, an MPPT optimizer and bypass switch component may be associated with each solar cell (or in some instances associated with each pair of parallel connected solar cells). FIG. 15 is a graph showing solar cell IV characteristics and Maximum Power Point (MPP) for maximum power harvesting at a given illumination (e.g., 1 SUN illumination). (The MPP is different for different levels of solar cell illumination intensities and ambient temperatures). In order to maximize power harvesting from sunrise to sunset and at all times, cell embodiments in accordance with the disclosed subject matter enable placement of MPPT Power Optimizer electronics on each cell backside (backplane) in order to maximize energy yield of PV slats and PV blind systems while achieving very high system level reliability for the PV blind system.

The MPPT power optimizer and bypass switch may be integrated to provide increased solar blind system power harvest (i.e., increased energy yield) and distributed shade management using low cost and reliable power electronic components associated and connected with an individual solar cell (or in some instances N solar cells connected in series or parallel or in hybrid parallel/series). Thus, for instance, a distributed (e.g., cell level) MPPT power optimizer and integrated bypass switch may operate together to harvest maximum power from unshaded cells in series with a shaded cell AND any available partial power generated by the shaded cells. The cell-level bypass switches also prevents hot spots in the fully shaded solar cells which are not producing any harvestable electrical power.

Further, it may be desirable to modify solar cell parameters to decrease the footprint and cost of the on-cell power electronics component. Importantly, increasing or scaling up the cell voltage and decreasing or scaling down the cell current reduces the power electronics component size, cost, and power dissipation losses at both the cell and module levels. Thus, scaling-up the voltage and scaling-down the current of a solar cell enhances and increases on-cell electronics performance and while reducing size and cost. In one embodiment this is achieved through an isled or tiled master solar (or a monolithically isled or monolithically tiled solar cell) comprising a plurality of monolithically-fabricated sub-cells which are electrically interconnected together in series or in a hybrid parallel-series arrangement to scale up the voltage and scale down the current (referred to and described herein as an isled cell or iCell).

Additionally, the embedded (embedded within the solar slat encapsulant/laminate) component (bypass switch and distributed MPPT power optimizer) may be positioned/attached with the solar cell using a monolithic module interconnection design and process (e.g., integrated with back-contact solar cell interconnection metallization, to reduce or eliminate tabbing, and supported by the solar cell backplane for backplane— attached back-contact solar cells) or attached as a discrete component on each individual cell backside (e.g., surface-mount technology— SMT or using electrical bussing connectors). Importantly, the cell backplane (e.g., thin prepreg sheet) decouples/buffers the sensitive active semiconductor (e.g., silicon) absorber from the electrical component and allows for more robust and reliable fabrication (e.g., soldering or conductive epoxy) and substantially enhanced in-field cell and module reliability (because of much smaller CTE mismatch induced stress of smaller footprint components impacting the semiconductor absorber) without comprising reliability of the solar cell while providing access to both base and emitter terminals of the backplane-attached back contact solar cell. In a two-level metallization structure, the coarser second level metallization layer (which may be used both to complete the solar cell metallization and also for cell to cell interconnections in a monolithic module implementation used for the slats) allows for reliable electronics component placement.

The primary functionalities of the MPPT power optimizer include: a DC to DC converter core (preferably a DC-to-DC buck or voltage step-down converter); an MPPT controller/power optimizer, and; a bypass switch. In one embodiment, the MPPT power optimizer may be formed as a CMOS integrated circuit, such as monolithic CMOS IC. The DC to DC converter core may be a buck (output voltage never higher than input, typically lower), boost (output voltage is higher than input, output current lower than input current), or buck/boost (both functionalities) converter. In some instances, a buck converter may be preferred as it may be typically less expensive and particularly for higher voltage solar cells such as monolithically-isled solar cells it's the desirable design embodiment. The DC to DC converter operates in conjunction with the MPPT controller/optimizer. The MPPT optimizer includes an algorithm that finds the maximum power point of solar cell on IV curve (see FIG. 15) under all conditions including different solar irradiance levels received by solar cell as well as different solar cell ambient temperatures. The MPPT algorithm allows the DC to DC converter to adjust its input conditions such that the solar cell effectively receives or experiences an effective load impedance that corresponds to the maximum power point (MPP) bias condition for the solar cell (or solar cells that share a single optimizer such as two monolithically-isled solar cells connected in parallel). Importantly, the MPPT power optimizer may be integrated with a bypass switch (such as the disclosed distributed bypass switch solutions including a bypass switch associated with a single cell or N cells connected in parallel, in series, or in parallel/series). The bypass switch may have an ultra-low forward bias (for instance <0.4 V to reduce power dissipation of the solar cell when it's fully shaded and the bypass switch is activated because there is negligible harvestable power to be harvested by the MPPT power optimizer) dependent on cell current, for example a Schottky barrier rectifier (SBR) or Schottky diode.

Described now with reference to the current-voltage current graph of FIG. 15, the bypass switch may engage whenever the current of the associated solar cell (for instance, a shaded solar cell) drops below a certain threshold compared with the current of cells which are not blocked or shaded (for example a 5-10% current drop, when not using a local cell-level MPPT power optimizer), and below the minimum current level for the MPPT power optimizer to be able to achieve maximum power point and to harvest useful power (when using a local cell-level MPPT power optimizer). The current threshold is based on the current difference of the cell between cell peak power and at short circuit current. In other words, the central MPPT power optimizer from a central inverter sets the series-connected string current at a suitable value to achieve maximum power for the unshaded solar cells.

Further, the MPPT power optimizer may operate autonomously and without a need for synchronization with the other embedded MPPT power optimizers within the module laminate— in other words each MPPT power optimizer autonomously and locally controls the associated solar cell (or plurality of electrically interconnected solar cells) based on circuit law. At the system level, a remote MPPT power optimizer governing the plurality of series-connected solar module laminates attached to its input, for instance the MPPT input of a string inverter or microinverter used for the PV blind system, may be utilized to govern the MPPT of the solar cells generating full power without any blockage (a relationship described in detail later). In other words, in the embodiments of this invention, the MPPT function for the "strong" or unshaded solar cells in a series— connected string of module laminates is performed by the main power converter unit (such as the string inverter with MPPT inputs), while the MPPT function for the "weak" or shaded solar cells (or the solar cells receiving less sunlight and hence producing less power than the stronger unshaded cells receiving the full available sunlight) is performed locally by the MPPT DC-to-DC power optimizer attached to the solar cell. For the strong or unshaded cells, the DC-DC-power optimizers associated with those cells operate in the non-switching pass-through mode with extremely low insertion loss, until if and when a strong cell is weakened (e.g., by shading) and produces less power compared to the other strong cells in the series-connected string of module laminates, or the solar cell operating point deviates beyond the allowed tolerance limit away from its MPP condition.

Alternatively, one inductor/capacitor pair may be integrated per MPPT power optimizer to reduce the current/voltage requirements of the inductor/capacitor pair and in some instances decrease the costs associated with higher rating values of inductor/capacitor.

Figure 16:
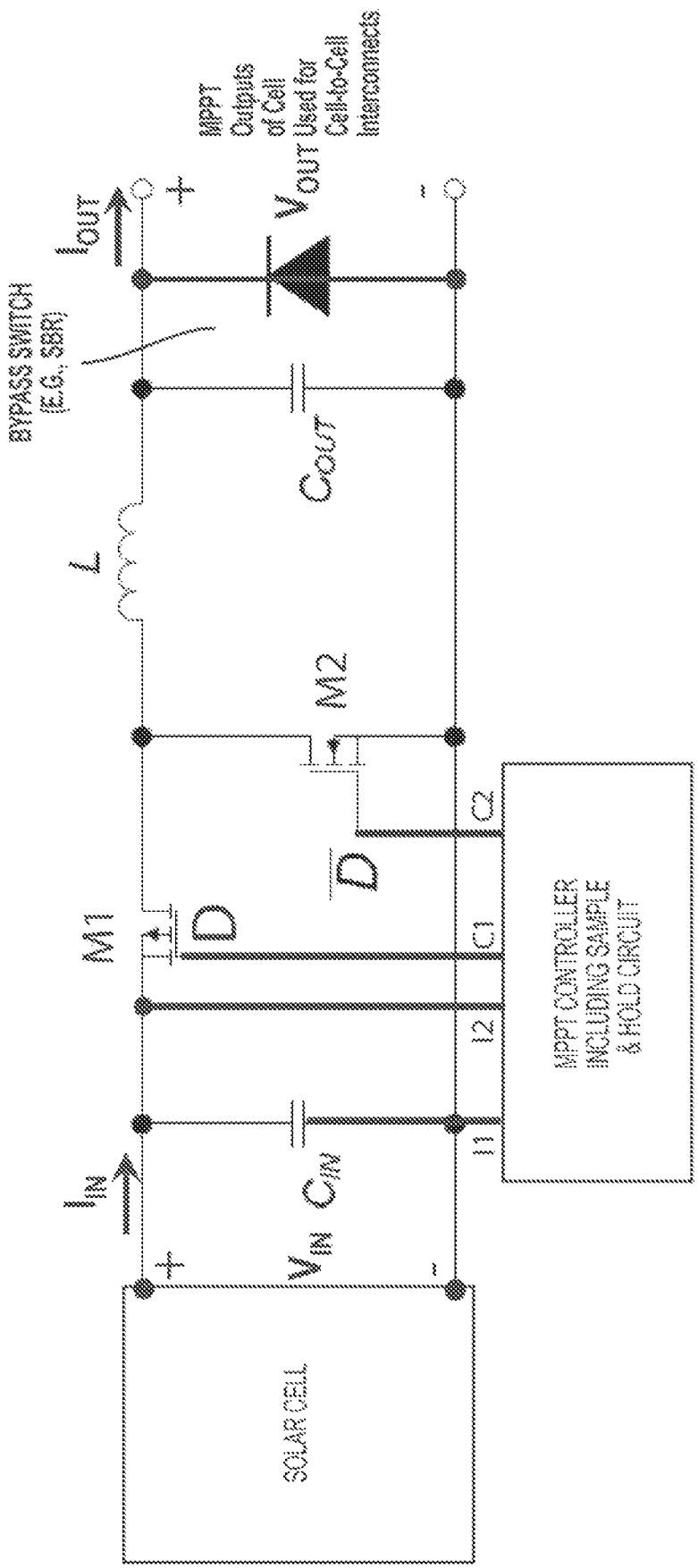
FIG. 16 is a cell level schematic circuit diagram showing an MPPT power optimizer, Inductor/Capacitor, and bypass switch embodiment.

FIG. 16 is a cell level schematic circuit diagram showing an MPPT power optimizer, Inductor/Capacitor, and bypass switch embodiment. Specific MPPT power optimizer, Inductor/Capacitor, and bypass switch implementation configurations may be selected be based on cost and complexity considerations. As shown in FIG. 16, the MPPT DC-DC buck converter package includes the components between the Vin and Vout (and may or may not comprise the bypass switch, e.g., SBR, Schottky Barrier Rectifier, etc.). The MPPT outputs are used for cell to cell interconnections. In the exemplary embodiments provided in FIG. 16, the following functional components are utilized as guidelines: a buck converter or step-down (voltage step-down) converter design; a typical buck converter MPPT power optimizer includes two switches (MOSFETs), gate drive control circuitry with an MPPT algorithm, 2 capacitors, and 1 inductor; the controller circuit includes the Maximum-Power-Point-Tracking (MPPT) algorithm comprising sample and hold circuit and switching driver circuitry based on which the switching signal (including the switching frequency and duty cycle, e.g. switching frequency from a few KHz to 10 MgHz and more particularly 1.3-3 MHZ) is generated and sent to the MOS transistors (gate drive signals for the two switching transistors shown), and; C1 & C2 are MPPT switching control outputs, I1 & I2 are MPPT Sample & Hold inputs, in pass-through mode, transistor switch M1 is closed and transistor switch M2 is open (100% duty cycle or no switching).

Thus, FIG. 16 is a schematic circuit diagram of an MPPT DC-DC Buck converter power optimizer with dedicated output-stage inductor L and capacitor CoUT and with output-stage bypass diode for distributed shade management. Each optimizer may be used in conjunction with one solar cell or a pair of parallel-connected solar cells and each MPPT DC-DC power optimizer has its own dedicated output-stage inductor L and capacitor CoUT.

Figure 17:
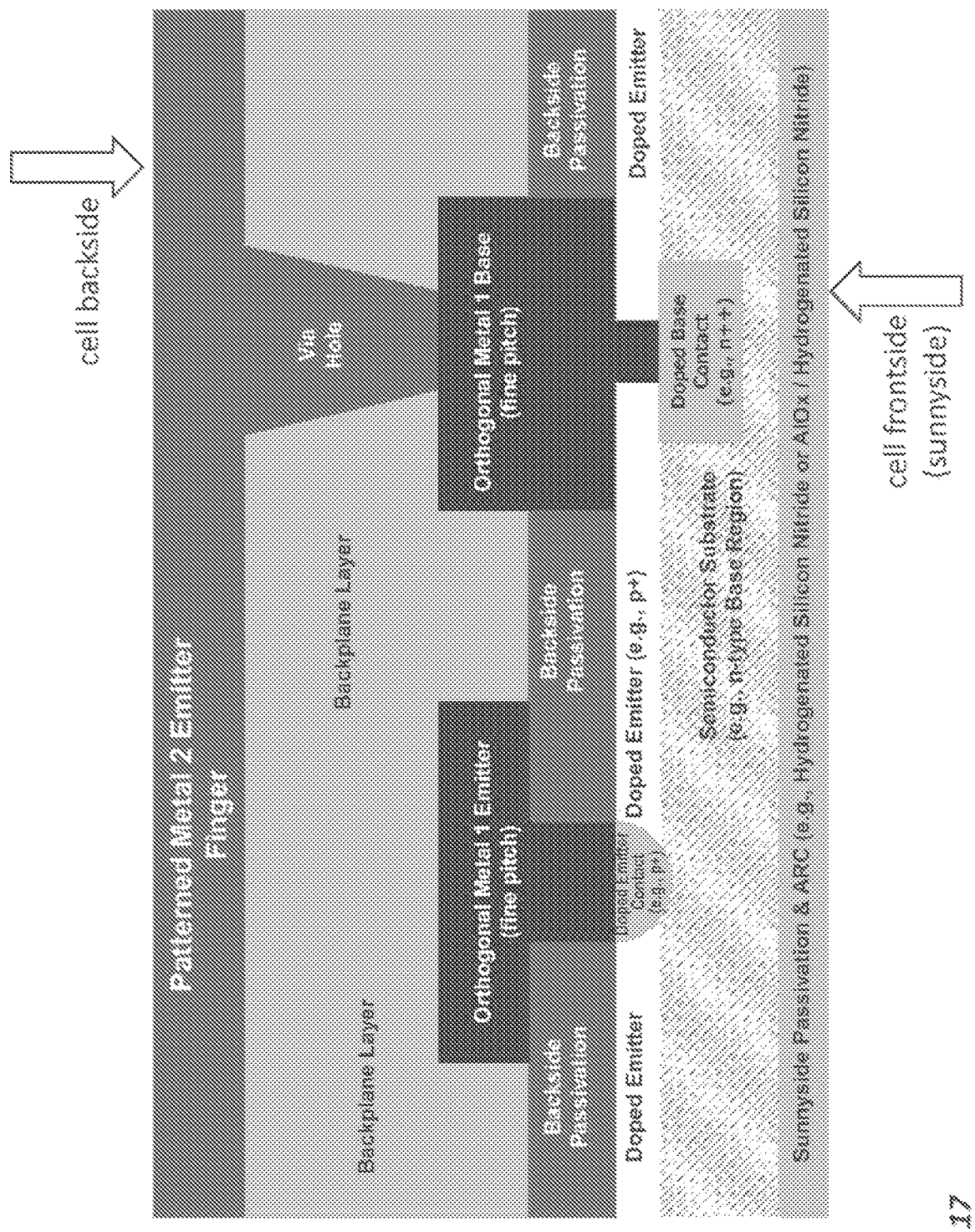
FIG. 17 is a detailed cross-sectional diagram of an exemplary back contact back junction solar cell.

FIG. 17 is a schematic cross-sectional diagram of an exemplary back contact back junction solar cell. The back-contact solar cell of FIG. 17 utilizes a two level metallization structure Metal 1 (M1) in conjunction with an electrically insulating backplane layer, providing base and emitter metallization and Metal 2 (M2) patterned orthogonally to fine-pitched interdigitated M1 and providing cell to cell interconnection. An MPPT power optimizer and bypass switch component may be attached, for example using surface mount technology, directly attached and connected to the M2 metallization between the base and emitter busbars to provide increased solar cell power harvesting and cell-level shade management capabilities.

In some instances, the voltage may be scaled up and the current scaled down current to enable use of much smaller/less expensive components (allowing for lamination improvement and reducing component package and module thickness) and reduce dissipation losses associated with bulkier components. Locally at the cell level, reducing size of component reduces dissipation losses (in some instances resulting in a fraction of the dissipation losses). Further, reducing size of MPPT chip improves reliability and practicality and reduces cost.

A solar cell having isled sub-cells and referred to herein as an iCell may be used to increase (scale-up) voltage and decrease (scale-down) current to enable low-cost, low-loss distributed power electronics.

Physically or regionally isolated isles (i.e., the initial semiconductor substrate partitioned into a plurality of substrate isles supported on a shared continuous backplane) are formed from one initially continuous semiconductor layer or substrate—thus the resulting isles (for instance, trench isolated from one another using trench isolation regions or cuts through the semiconductor substrate) are monolithic— attached to and supported by a continuous backplane (for example a flexible backplane such as an electrically insulating prepreg layer). The completed solar cell (referred to as a master cell or iCell) comprises a plurality of monolithically integrated isles/sub-cells/mini-cells, in some instances attached to a flexible backplane (e.g., one made of a prepreg materials, for example having a relatively good Coefficient of Thermal Expansion or CTE match to that of the semiconductor substrate material such as crystalline silicon), providing increased solar cell flexibility and pliability while suppressing or even eliminating micro-crack generation and crack propagation or breakage in the semiconductor substrate layer. Further, a flexible monolithically isled (or monolithically integrated group of isles) cell (also called an iCell) provides improved cell planarity and relatively small or negligible cell bow throughout solar cell processing steps such as any optional semiconductor layer thinning etch, texture etch, post-texture clean, PECVD passivation and anti-reflection coating (ARC) processes (and in some processing embodiments also allows for sunny-side-up PECVD processing of the substrates due to mitigation or elimination of thermally-induced cell warpage), and final solar cell metallization.

Figure 18:
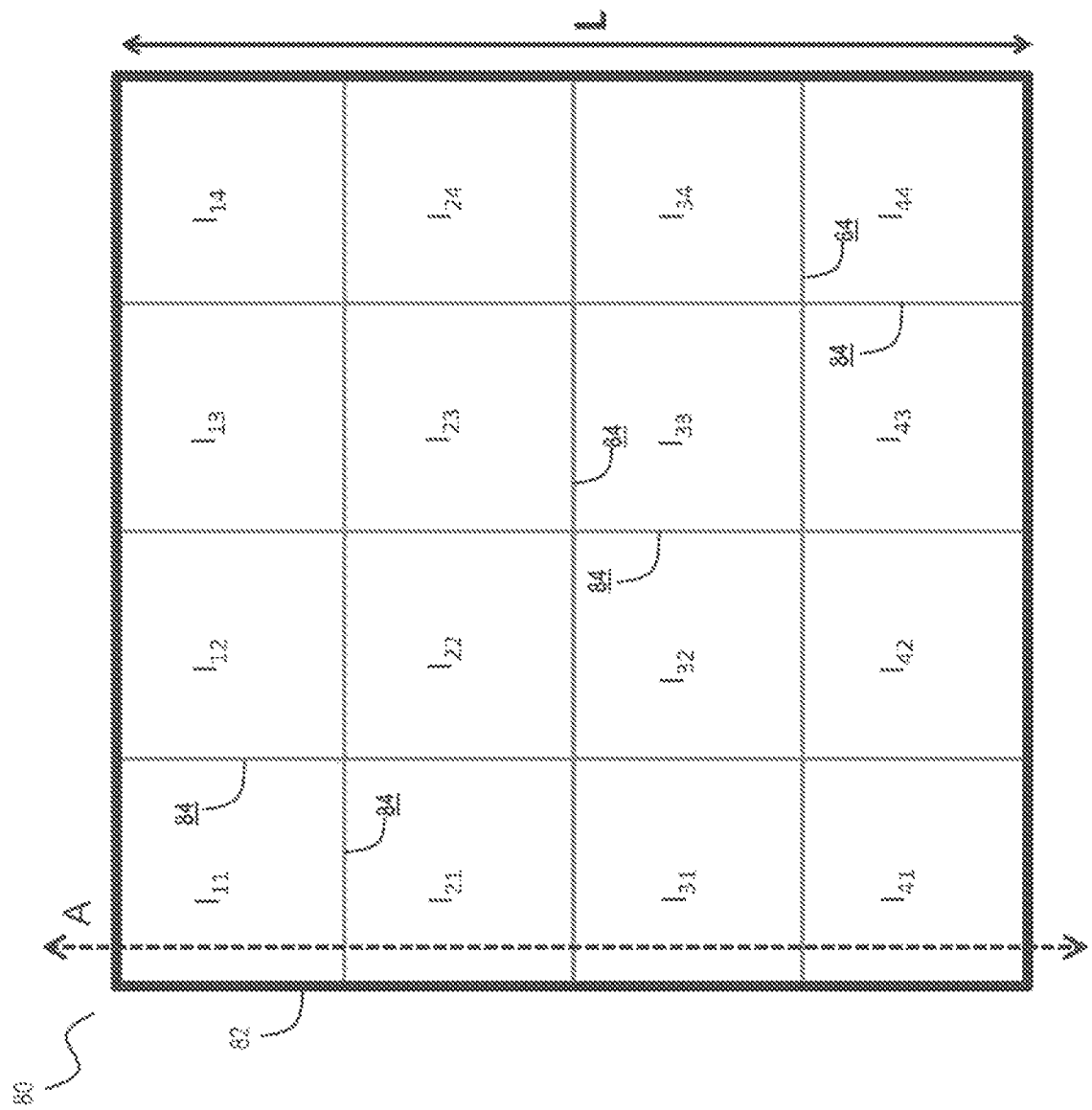
FIG. 18 is a representative schematic plan view (frontside or sunnyside view) diagram of an icell pattern.

FIG. 18 is a representative schematic plan view (frontside or sunnyside view) diagram of an icell pattern (shown for square-shaped isles and square-shaped icell) along with uniform-size (equal-size) square-shaped isles for N×N=4×4=16 isles (or sub-cells, mini-cells, tiles). This schematic diagram shows a plurality of isles (shown as 4×4=16 isles) partitioned by trench isolation regions. FIG. 18 is a schematic diagram of a top or plan view of a 4×4 uniform isled (tiled) master solar cell or iCell 80 defined by cell peripheral boundary or edge region 82, having a side length L, and comprising sixteen (16) uniform square-shaped isles formed from the same original continuous substrate and identified as In through 144 attached to a continuous backplane on the master cell backside (backplane and solar cell backside not shown). Each isle or sub-cell or mini-cell or tile is defined by an internal isle peripheral boundary (for example, an isolation trench cut through the master cell semiconductor substrate thickness and having a trench width substantially smaller than the isle side dimension, with the trench width no more than 100's of microns and in some instances less than or equal to about 100 μm—for instance, in the range of a few up to about 100 μm) shown as trench isolation or isle partitioning borders 84. Main cell (or iCell) peripheral boundary or edge region 82 has a total peripheral length of 4 L; however, the total iCell edge boundary length comprising the peripheral dimensions of all the isles comprises cell peripheral boundary 82 (also referred to as cell outer periphery) and trench isolation borders 84. Thus, for an iCell comprising N×N isles or mini-cells in a square-shaped isle embodiment, the total iCell edge length is N×cell outer periphery. In the representative example of FIG. 18 showing an iCell with 4×4=16 isles, N=4, so total cell edge length is 4× cell outer periphery 4 L=16 L (hence, this icell has a peripheral dimension which is 4 times larger than that of a standard square shaped cell). For a square-shaped master cell or icell with dimensions 156 mm×156 mm, square isle side dimensions are approximately 39 mm×39 mm and each isle or sub-cell has an area of 15.21 cm² per isle.

FIGS. 19A and 19B are representative schematic cross-sectional view diagrams of a backplane-attached solar cell during different stages of solar cell processing. FIG. 19A shows the simplified cross-sectional view of the backplane-attached solar cell after processing steps and before formation of the partitioning trench regions. FIG. 19B shows the simplified cross-sectional view of the backplane-attached solar cell after some processing steps and after formation of the partitioning trench regions to define the trench-partitioned isles. FIG. 19B shows the schematic cross-sectional view of the iCell of FIG. 18 along the view axis A of FIG. 18 for an iCell pattern (shown for square-shaped isles and square-shaped iCell), indicating the uniform-size (equal-size) square-shaped isles for N×N=4×4=16 isles (or sub-cells, mini-cells, tiles).

FIGS. 19A and 19B are schematic cross-sectional diagrams of a monolithic master cell semiconductor substrate on a backplane before formation of trench isolation or partitioning regions, and a monolithic isled or tiled solar cell on a backplane formed from a master cell after formation of trench isolation or partitioning regions, respectively. FIG. 19A comprises semiconductor substrate 90 having width (semiconductor layer thickness) W and attached to backplane 92 (e.g., an electrically insulating continuous backplane layer, for instance, a thin flexible sheet of prepreg). FIG. 19B is a cross-sectional diagram of an isled solar cell (iCell)—shown as a cross-sectional diagram along the A axis of the cell of FIG. 18. Shown, FIG. 19B comprises isles or mini-cells $I_{11}$, $I_{21}$, $I_{31}$, and $I_{41}$ each having a trench-partitioned semiconductor layer width (thickness) Wand attached to backplane 92. The semiconductor substrate regions of the mini-cells are physically and electrically isolated by an internal peripheral partitioning boundary, trench partitioning borders 94. The semiconductor regions of isles or mini-cells $I_{11}$, $I_{21}$, $I_{31}$, and $I_{41}$ are monolithically formed from the same continuous semiconductor substrate shown in FIG. 19A. The icell of FIG. 19B may be formed from the semiconductor/backplane structure of FIG. 19A by forming internal peripheral partitioning boundaries in the desired mini-cell shapes (e.g., square shaped mini-cells or isles) by trenching through the semiconductor layer to the attached backplane (with the trench-partitioned isles or mini-cells being supported by the continuous backplane). Trench partitioning of the semiconductor substrate to form the isles does not partition the continuous backplane sheet, hence the resulting isles remain supported by and attached to the continuous backplane layer or sheet. Trench partitioning formation process through the initially continuous semiconductor substrate thickness may be performed by, for example, pulsed laser ablation or dicing, mechanical saw dicing, ultrasonic dicing, plasma dicing, water jet dicing, or another suitable process (dicing, cutting, scribing, and trenching may be used interchangeably to refer to the process of trench isolation process to form the plurality of isles or mini-cells or tiles on the continuous backplane). Again, the backplane structure may comprise a combination of a backplane support sheet in conjunction with a patterned metallization structure, with the backplane support sheet providing mechanical support to the semiconductor layer and structural integrity for the resulting iCell (either a flexible solar cell using a flexible backplane sheet or a rigid solar cell using a rigid backplane sheet or a semi-flexible solar cell using a semi-flexible backplane sheet). Again, while we may use the term backplane to the combination of the continuous backplane support sheet and patterned metallization structure, more commonly we use the term backplane to refer to the backplane support sheet (for instance, an electrically insulating thin sheet of prepreg) which is attached to the semiconductor substrate backside and supports both the icell semiconductor substrate regions and the overall patterned solar cell metallization structure.

Figure 20:
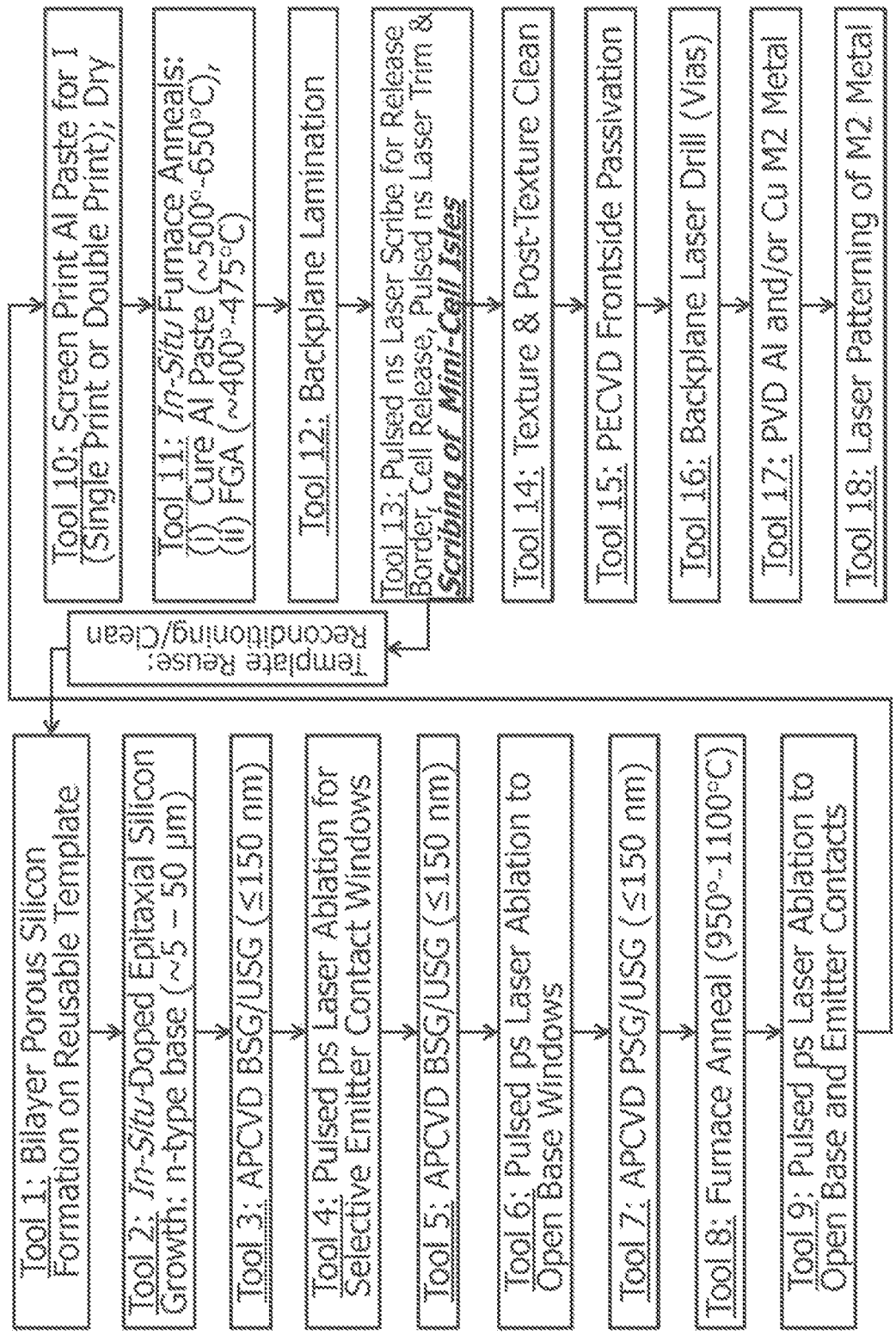
FIG. 20 is a representative backplane-attached icell manufacturing process flow based on epitaxial silicon and porous silicon lift-off processing.

FIG. 20 is a representative backplane-attached iCell manufacturing process flow based on epitaxial silicon and porous silicon lift-off processing. This process flow is for fabrication of backplane-attached, back-contact/back-junction solar cells (iCells) using two patterned layers of solar cell metallization (M1 and M2). This example is shown for a solar cell with selective emitter, i.e., a main patterned field emitter with lighter emitter doping formed using a lighter boron-doped silicate glass (first BSG layer with smaller boron doping deposited by Tool 3), and more heavily-boron-doped emitter contact regions using a more heavily boron-doped silicate glass (second BSG layer with larger boron doping deposited by Tool 5). While this example is shown for an IBC solar cell using a double-BSG selective emitter process, the iCell designs are applicable to a wide range of other solar cell structures and process flows, including but not limited to the IBC solar cells without selective emitter (i.e., same emitter boron doping in the field emitter and emitter contact regions). This example is shown for an IBC iCell with an n-type base and p-type emitter. However, the polarities can be changed so that the solar cell has p-type base and n-type emitter instead.

Figure 21:
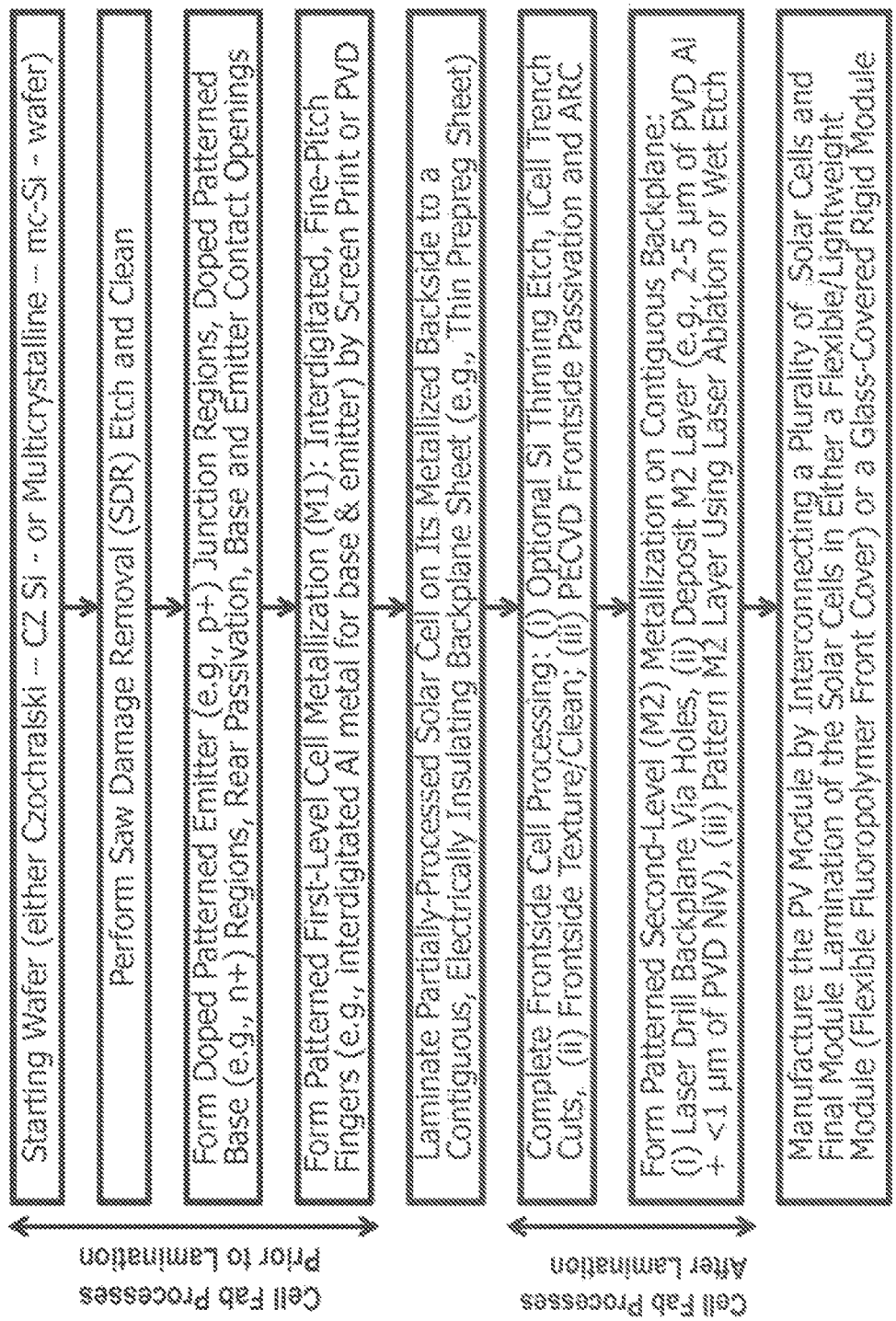
FIG. 21 is a high level solar cell and module fabrication process flow embodiment using starting crystalline (monocrystalline or multi-crystalline) silicon wafers.

FIG. 21 is a high level solar cell and module fabrication process flow embodiment using starting crystalline (monocrystalline or multi-crystalline) silicon wafers. FIG. 21 shows a high-level iCell process flow for fabrication of backplane-attached back-contact/back-junction (IBC) iCells using two layers of metallization: M1 and M2. The first layer or level of patterned cell metallization M1 is formed as essentially the last process step among a plurality of front-end cell fab processes prior to the backplane lamination to the partially processed iCell (or a larger continuous backplane attached to a plurality of partially processed iCells when fabricating monolithic modules as described earlier). The front-end cell fab processes outlined in the top 4 boxes of FIG. 21 essentially complete the back-contact/back-junction solar cell backside structure through the patterned M1 layer. Patterned M1 is designed to conform to the iCell isles (sub-cells or mini-cells) and comprises a fine-pitch interdigitated metallization pattern as described for the epitaxial silicon iCell process flow outlined in FIG. 20. In FIG. 21, the fifth box from the top involves attachment or lamination of the backplane layer or sheet to the partially processed icell backside (or to the backsides of a plurality of partially processed iCells when making a monolithic module)— this process step is essentially equivalent to the one performed by Tool 12 in FIG. 20 in case of epitaxial silicon lift-off process). In FIG. 21, the sixth and seventh boxes from the top outline the back-end or post-backplane-attachment (also called post-lamination) cell fab processes to complete the remaining frontside (optional silicon wafer thinning etch to form thinner silicon absorber layer if desired, partitioning trenches, texturization, post-texturization cleaning, passivation and ARC) as well as the via holes and second level or layer of patterned metallization M2. The "post-lamination" processes (or the back-end cell fab processes performed after the backplane attachment) outlined in the sixth and seventh boxes of FIG. 21 essentially correspond to the processes performed by Tools 13 through 18 for the epitaxial silicon lift off process flow shown in FIG. 20. The bottom box in FIG. 21 describes the final assembly of the resulting iCells into either flexible, lightweight PV modules or into rigid glass-covered PV modules. If the process flow results in a monolithic module comprising a plurality of iCells monolithically interconnected together by the patterned M2 (as described earlier for the epitaxial silicon lift off process flow), the remaining PV module fabrication process outlined in the bottom box of FIG. 21 would be simplified since the plurality of the interconnected iCells sharing a larger continuous backplane and the patterned M2 metallization for cell-to-cell interconnections are already electrically interconnected and there is no need for tabbing and/or stringing and/or soldering of the solar cells to one another. The resulting monolithic module can be laminated into either a flexible, lightweight PV module (for instance, using a thin flexible fluoropolymer cover sheet such as ETFE or PFE on the frontside instead of rigid/heavy glass cover sheet) or a rigid, glass-covered PV module.

The design of isles or mini-cells (sub-cells) of an iCell may include various geometrical shapes such as squares, triangles, rectangles, trapezoids, polygons, honeycomb hexagonal isles, or many other possible shapes and sizes. The shapes and sizes of isles, as well as the number of isles in an iCell may be selected to provide optimal attributes for one or a combination of the following considerations: (i) overall crack elimination or mitigation in the master cell (iCell); (ii) enhanced pliability and flexibility/bendability of master cell (iCell) without crack generation and/or propagation and without loss of solar cell or module performance (power conversion efficiency); (iii) reduced metallization thickness and conductivity requirements (and hence, reduced metallization material consumption and processing cost) by reducing the master cell (iCell) current and increasing the iCell voltage (through series connection or a hybrid parallel-series connection of the isles in the monolithic iCell, resulting in scaling up the voltage and scaling down the current); and (iv) providing relatively optimum combination of electrical voltage and current ranges in the resulting icell to facilitate and enable implementation of inexpensive distributed embedded electronics components on the iCells and/or within the laminated PV modules comprising iCells, including but not limited to at least one bypass switch (e.g., rectifying pn junction diode or Schottkty barrier diode) per iCell, maximum-power-point tracking (MPPT) power optimizers (at least a plurality of MPPT power optimizers embedded in each module, with each MPPT power optimizer dedicated to at least 1 to a plurality of series-connected and/or parallel-connected iCells), PV module power switching (with remote control on the power line in the installed PV array in order to switch the PV modules on or off as desired), module status (e.g., power delivery and temperature) during operation of the PV module in the field, etc. For example and as described earlier, in some applications and instances when considered along with other requirements, it may be desired to have smaller (for example triangular shaped) isles near the periphery of the master cell (icell) to reduce crack propagation and/or to improve flexibility/bendability of the resulting iCells and flexible, lightweight PV modules.

Partitioning the main/master cell into an array of isles or sub-cells (such as an array of N×N square or pseudo-square shaped or K triangular-shaped or a combination thereof) and interconnecting those isles in electrical series or a hybrid combination of electrical parallel and electrical series reduces the overall master cell current for each isle or mini-cell—for example by a factor of $N \times N = N^2$ if all the square-shaped isles are connected in electrical series, or by a factor of K if all the triangular-shaped isles are connected in series. And while the main/master cell or iCell has a maximum-power (mp) current of $I_{mp}$, and a maximum-power voltage of $V_{mp}$, each series-connected isle (or subgroups of isles connected in parallel and then in series) will have a maximum-power current of $I_{mp}/N^2$ (assuming $N^2$ isles connected in series) and a maximum-power voltage of $V_{mp}$ (no change in voltage for the isle). Designing the first and second metallization layer patterns, M1 and M2 respectively, such that the isles on a shared continuous or continuous backplane are connected in electrical series results in a main/master cell or icell with a maximum-power current of $I_{mp}/N_2$ and a maximum power voltage of $N^2 \times V_{mp}$ or a cell (icell) maximum power of $P_{mp} = I_{mp} \times V_{mp}$ (the same maximum power as a master cell without mini-cell partitioning).

Thus, a monolithically isled master cell or iCell architecture reduces ohmic losses due to reduced solar cell current and allows for thinner solar cell metallization structure generally and a much thinner M2 layer if applicable or desired. Further, reduced current and increased voltage of the master cell or iCell allows for relatively inexpensive, high-efficiency, maximum-power-point-tracking (MPPT) power optimizer electronics to be directly embedded into the PV module and/or integrated on the solar cell backplane.

In an all-series-connected cell, an M2 cell metallization design which results in sufficiently low or negligible ohmic losses should be used due to the current flow on lateral M2 connectors between the adjacent series-connected columns. Lateral M2 jumpers or connectors (which may be formed in conjunction with the patterned M2 layer) are used to interconnect the adjacent columns of iCell in electrical series.

Figure 22:
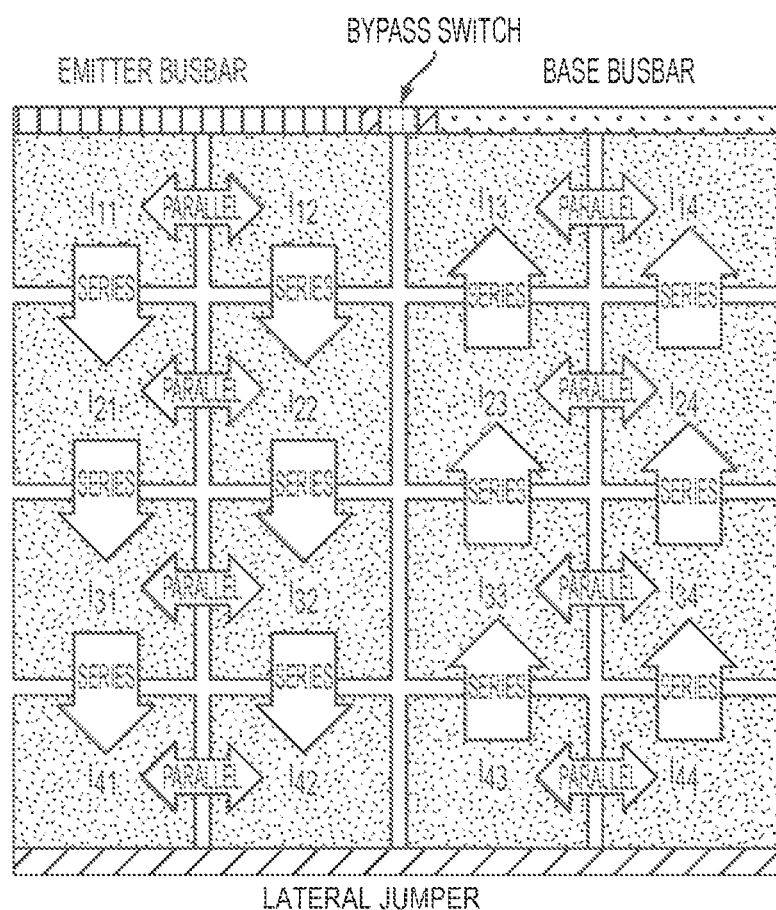
FIG. 22 is a top view of an icell having a 4×4 array of sub-cells connected in a 2×8 hybrid parallel design.
Figure 23:
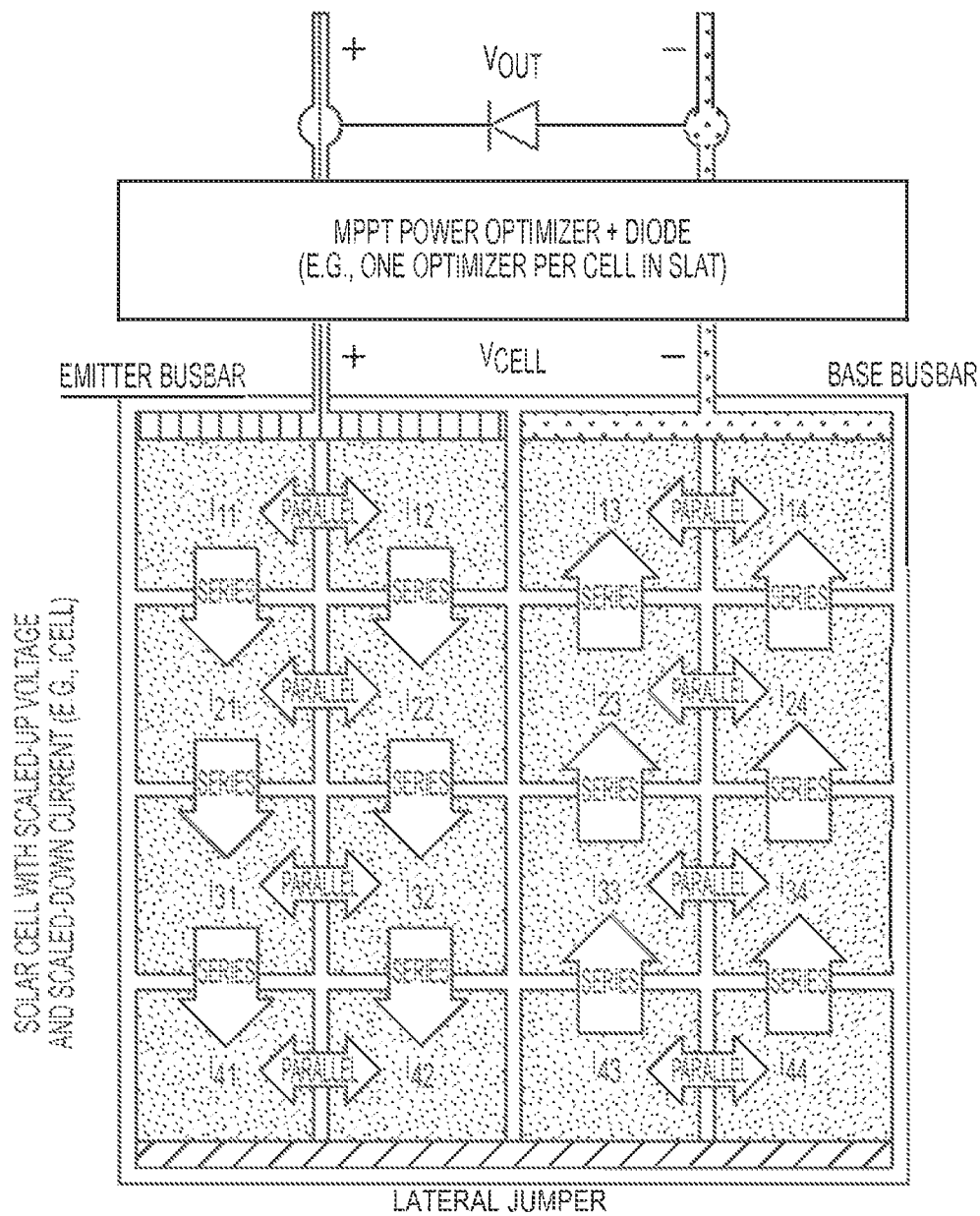
FIG. 23 shows the icell of FIG. 22 utilizing an MPPT DC-DC buck converter/power optimizer.

FIG. 22 is a top view of an iCell having a 4×4 array of sub-cells connected in a 2×8 hybrid parallel design. As noted, the disclosed solar cell results in much less current which allows for the use of inexpensive shade-management switch (bypass switch) as well as inexpensive, high-efficiency or high power transfer efficiency (e.g., >97%) MPPT DC-DC buck converter/power optimizer. FIG. 23 shows the iCell of FIG. 22 utilizing an MPPT DC-DC buck converter/power optimizer in accordance with the disclosed subject, thus providing for low-cost, distributed, embedded smart module power electronics solutions.

Figure 24:
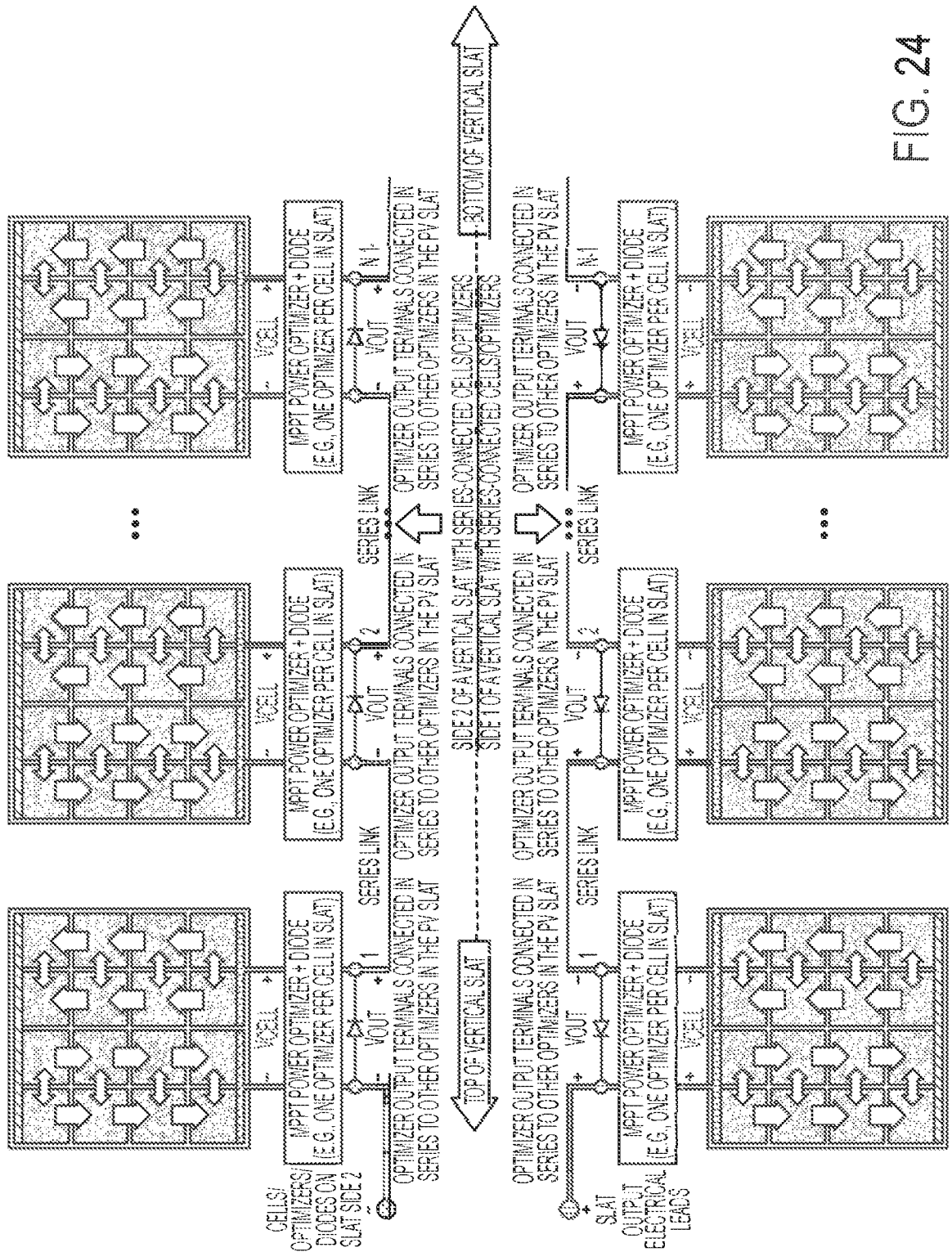
FIG. 24 is a functional diagram of a solar blind slat showing all icells and corresponding MPPT power optimizers and shade management diodes on the slat connected in electrical series.

FIG. 24 is a functional diagram of a solar blind slat showing all iCells and corresponding MPPT power optimizers and shade management diodes, each iCell in FIG. 24 consistent with the iCell shown in detail in FIG. 23, on the slat connected in electrical series. For case of demonstration, this figures shows the solar cells on both sides of each slat in the plane of the paper (in reality the top and bottom rows of solar cells shown for a slat are mounted on the two sides of the slat). As shown in FIG. 24, each slat side having N solar cells (with N being an integer number) and corresponding power optimizers and diodes and thus each slat having 2N solar cells and corresponding power optimizers and diodes. Each solar cell in this embodiment is an iCell with scaled-up voltage and scaled-down current in order to facilitate low-cost implementation of the distributed power electronics components (MPPT power optimizer and bypass diode on each iCell). The outputs of the MPPT power optimizers associated with the plurality of the iCells in the slat are connected in electrical series. And although FIG. 24 shows the schematic diagram of only one slat, the PV blind system may have a plurality of (for instance, M with M being an integer number) slats (positioned either vertically or horizontally in a vertical blind or in a horizontal blind, respectively). The plurality of PV slats (with each PV slat having a plurality of series-connected MPPT power optimizers/solar cells) in the PV blind system may be connected in electrical series, electrical parallel, or a hybrid combination of electrical series and parallel. The DC outputs of the PV blind system (not shown in this figure) are then connected to a microinverter or a string inverter in order to produce AC electricity for an AC load or connection to an AC wall plug.

The disclosed solutions provide solar PV blinds for efficient multi-faceted power harvesting. The foregoing description of the exemplary embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:

1. A solar photovoltaic blind slat, comprising:
   a plurality of backplane supported solar cells having a light receiving frontside and a backside, each of said solar cell backsides attached to a slat core made of an electrically insulating prepreg material, said slat core forming an electrically insulating backplane for said backside of each of said plurality of solar cells, said light receiving frontside facing externally and said backside facing said slat core;
   each of said solar cells partitioned into a plurality of sub-cells, said plurality of sub-cells scaling up the voltage and scaling down the current of each of said solar cells;
   said slat core having at least a first side and a second side;
   said solar cells attached on said first side and said second side;
   each of said first side and said second side supporting a string of solar cells connected in series and a string of said sub-cells of each of said solar cells connected in series; and
   a maximum-power-point tracking power optimizer corresponding to each of said plurality of solar cells.

2. The solar photovoltaic blind slat of claim 1, wherein said maximum-power-point tracking power optimizer is a maximum-power-point tracking power optimizer component formed as a CMOS integrated circuit.

3. The solar photovoltaic blind slat of claim 1, wherein said maximum-power-point tracking power optimizer is embedded within said slat core.

4. The solar photovoltaic blind slat of claim 1, wherein said slat core is planar.

5. The solar photovoltaic blind slat of claim 1, wherein said slat core is curved.

6. The solar photovoltaic blind slat of claim 1, wherein said slat core is elliptical.

7. The solar photovoltaic blind slat of claim 1, wherein said slat core is convex.

8. The solar photovoltaic blind slat of claim 1, wherein said slat core is cylindrical.

9. The solar photovoltaic blind slat of claim 1, wherein said slat core is concave.

10. The solar photovoltaic blind slat of claim 1, wherein said plurality of solar cells are back contact solar cells.

11. The solar photovoltaic blind slat of claim 1, further comprising a plurality of blind slats electrically connected in electrical series.

12. The solar photovoltaic blind slat of claim 1, further comprising a plurality of blind slats electrically connected in electrical parallel.

13. A photovoltaic solar blind system, comprising:
    a plurality of slats, each of said slats comprising:
    a plurality of backplane supported solar cells having a light receiving frontside and a backside, each of said solar cell backsides attached to a slat core made of an electrically insulating prepreg material, said slat core forming an electrically insulating backplane for said backside of each of said plurality of solar cells, said light receiving frontside facing externally and said backside facing said slat core;
    each of said solar cells partitioned into a plurality of sub-cells, said plurality of sub-cells scaling up the voltage and scaling down the current of each of said solar cells;

said slat core having at least a first side and a second side; said solar cells attached on said first side and said second side;

each of said first side and said second side supporting a string of solar cells connected in series and a string of said sub-cells of each of said solar cells connected in series;

and, a maximum-power-point tracking power optimizer corresponding to each of said plurality of solar cells.

14. The photovoltaic solar blind system of claim 13, wherein said maximum-power-point tracking power optimizer is a maximum-power-point tracking power optimizer component formed as a CMOS integrated circuit.

15. The photovoltaic solar blind system of claim 13, wherein said maximum-power-point tracking power optimizer is embedded within said slat core.

16. The photovoltaic solar blind system of claim 13, wherein said plurality of slats are vertical.

17. The photovoltaic solar blind system of claim 13, wherein said plurality of slats are horizontal.

18. The photovoltaic solar blind system of claim 13, wherein said plurality of slats are connected in electrical series.

19. The photovoltaic solar blind system of claim 13, wherein said plurality of slats are connected in electrical parallel.

* * * * *